United States Patent [19]

Small et al.

[11] 4,015,558
[45] Apr. 5, 1977

[54] VAPOR DEPOSITION APPARATUS

[75] Inventors: Edward A. Small; Richard H. Edwards; Eugene A. Eufusia; Robert M. Clary; Nils H. Bergfelt, all of Santa Rosa, Calif.

[73] Assignee: Optical Coating Laboratory, Inc., Santa Rosa, Calif.

[22] Filed: May 5, 1975

[21] Appl. No.: 574,300

Related U.S. Application Data

[63] Continuation of Ser. No. 311,783, Dec. 4, 1972, abandoned.

[52] U.S. Cl. .................................. 118/6; 118/7; 118/49.1; 118/64; 118/620

[51] Int. Cl.² ........................................ C23C 13/10

[58] Field of Search ........... 118/2, 6, 7, 8, 48–49.5; 427/248–252, 69, 70, 78, 91, 99, 50, 51, 107, 109, 124

[56] References Cited

UNITED STATES PATENTS

| | | | |
|---|---|---|---|
| 2,671,034 | 3/1954 | Steinfeld | 427/131 |
| 2,975,753 | 3/1961 | Hayes | 118/49 |
| 2,997,979 | 8/1961 | Tassara | 118/49 |
| 3,294,670 | 12/1966 | Charschan et al. | 118/49 X |
| 3,469,560 | 9/1969 | Bukkila et al. | 118/6 |
| 3,495,724 | 2/1970 | Beckham et al. | 118/8 X |
| 3,568,632 | 3/1971 | Cawthon | 118/49 |

OTHER PUBLICATIONS

*IBM Technical Disclosure Bulletin,* Barber, "Two Chamber Air–to–Vacuum Lock System", vol. 11, No. 7 (Dec. 1968) pp. 757, 758.

*Primary Examiner*—Morris Kaplan
*Attorney, Agent, or Firm*—Flehr, Hohbach, Test, Albritton & Herbert

[57] ABSTRACT

Multi-layer coating apparatus and system for coating a substrate having a coating chamber and means for advancing the substrate in a horizontal position through the coating chamber. The coating chamber is provided with means for depositing the coating on the bottom side of the substrate as it is advanced through the chamber. Means is provided for preventing one substrate from bumping into another and for providing a predetermined spacing from the substrates as they are advanced through the coating chamber.

14 Claims, 20 Drawing Figures

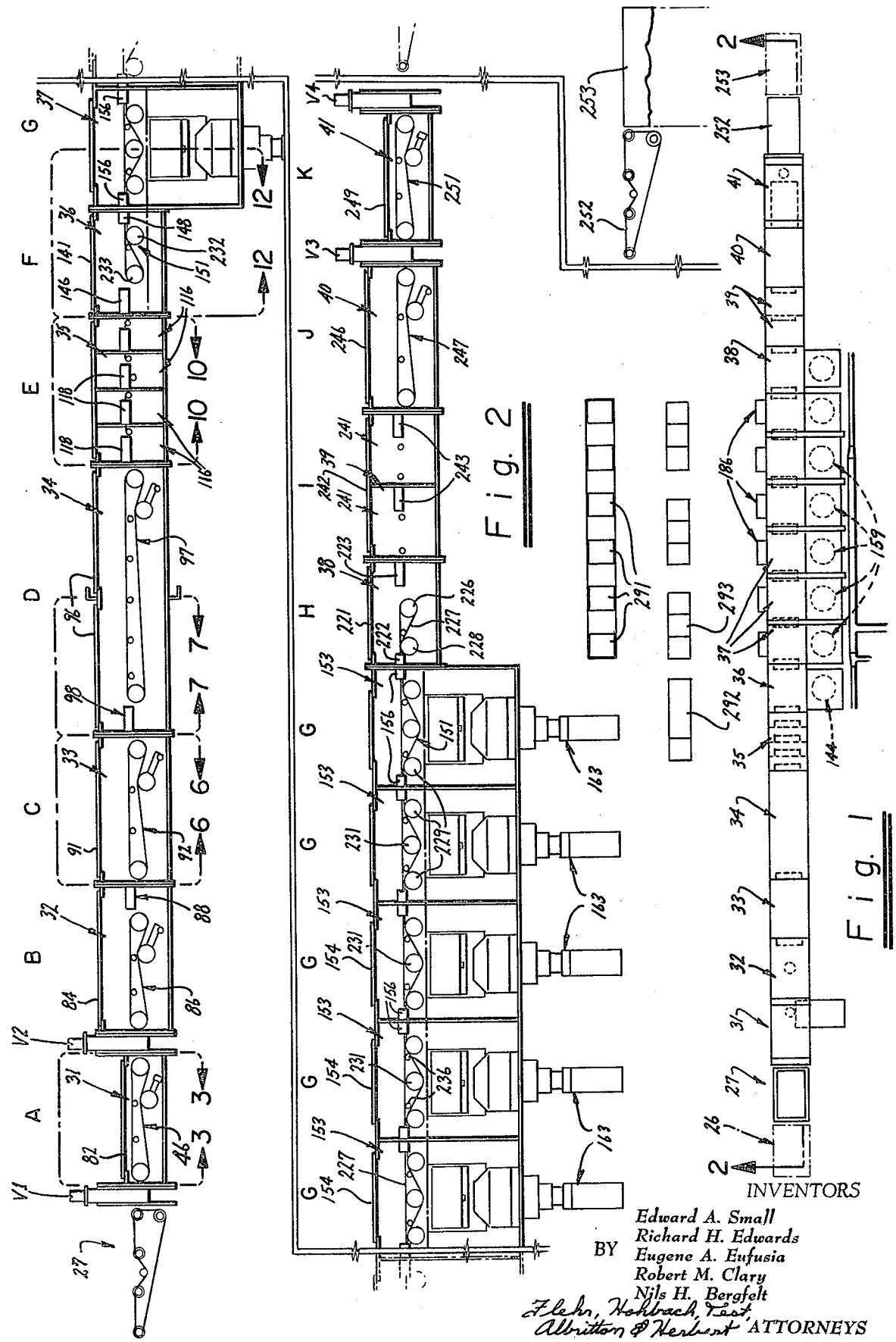

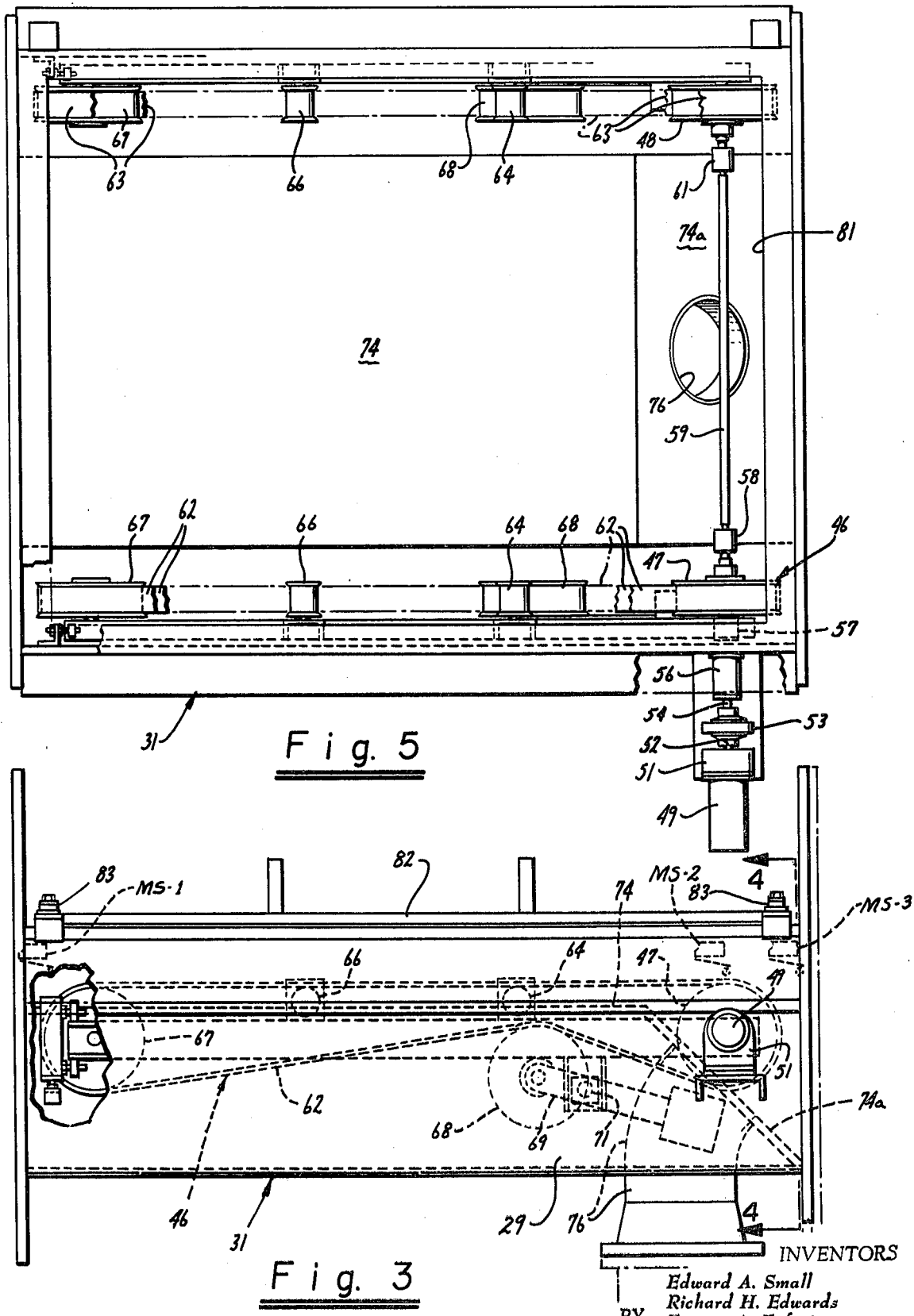

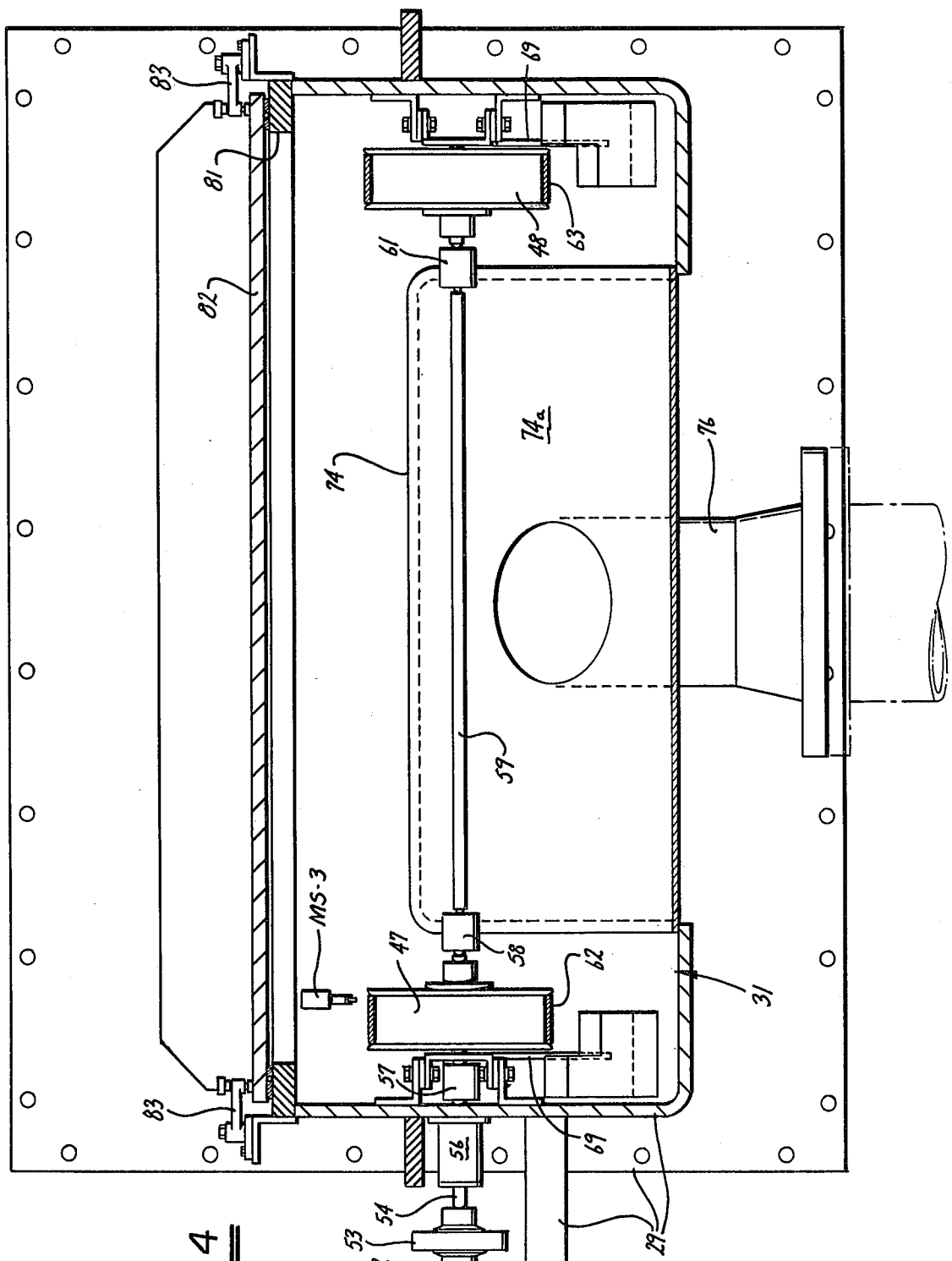

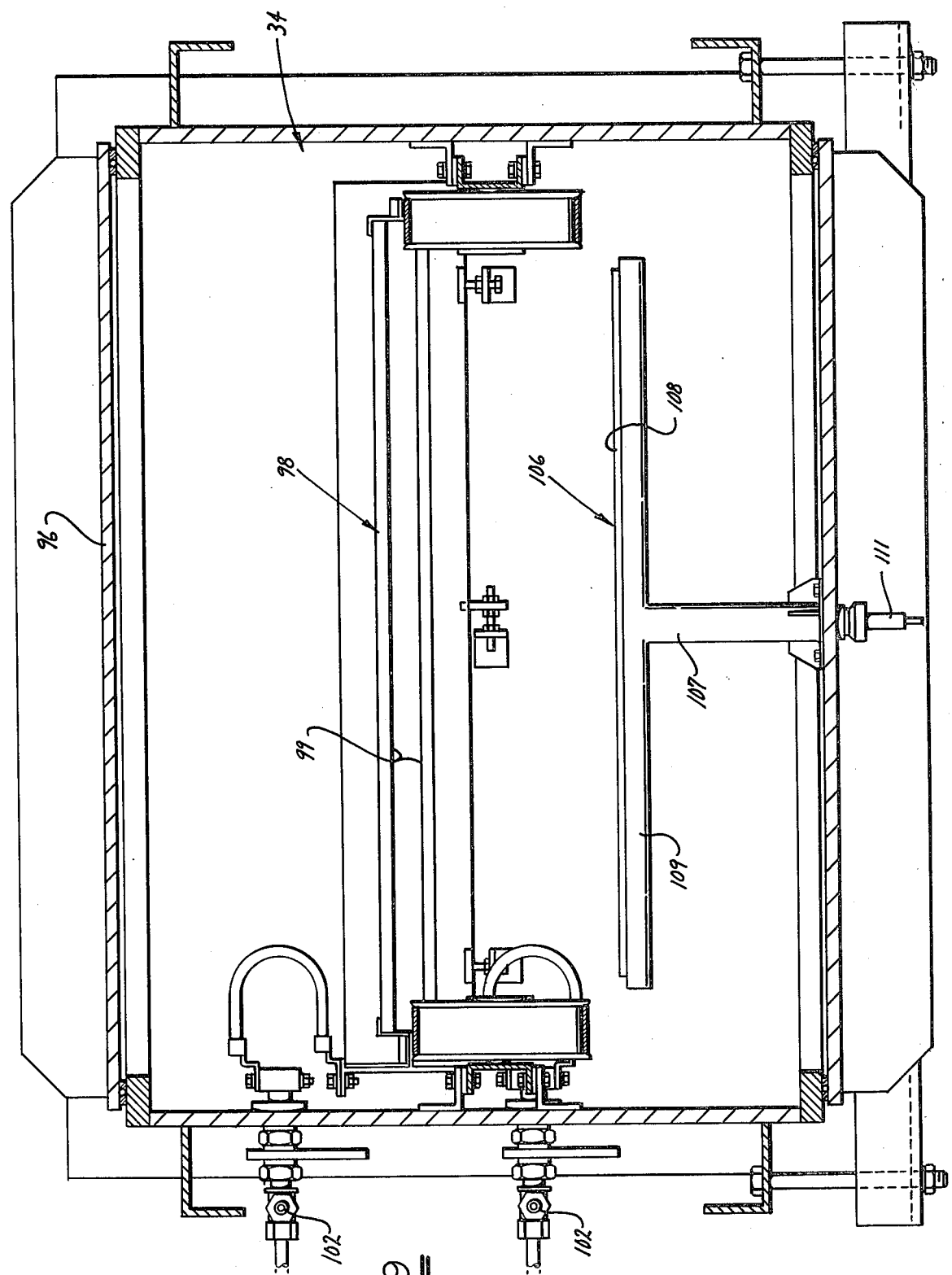

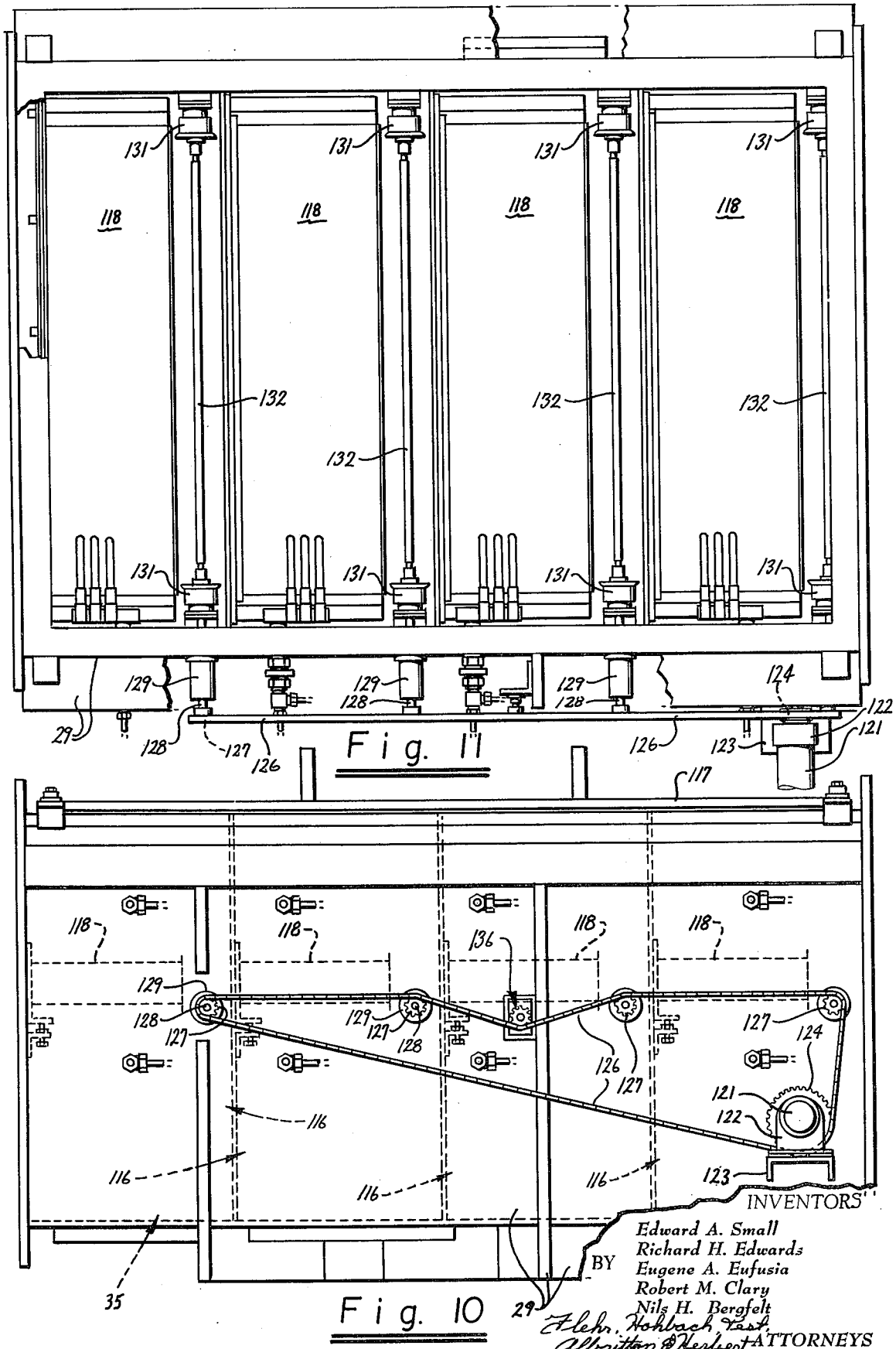

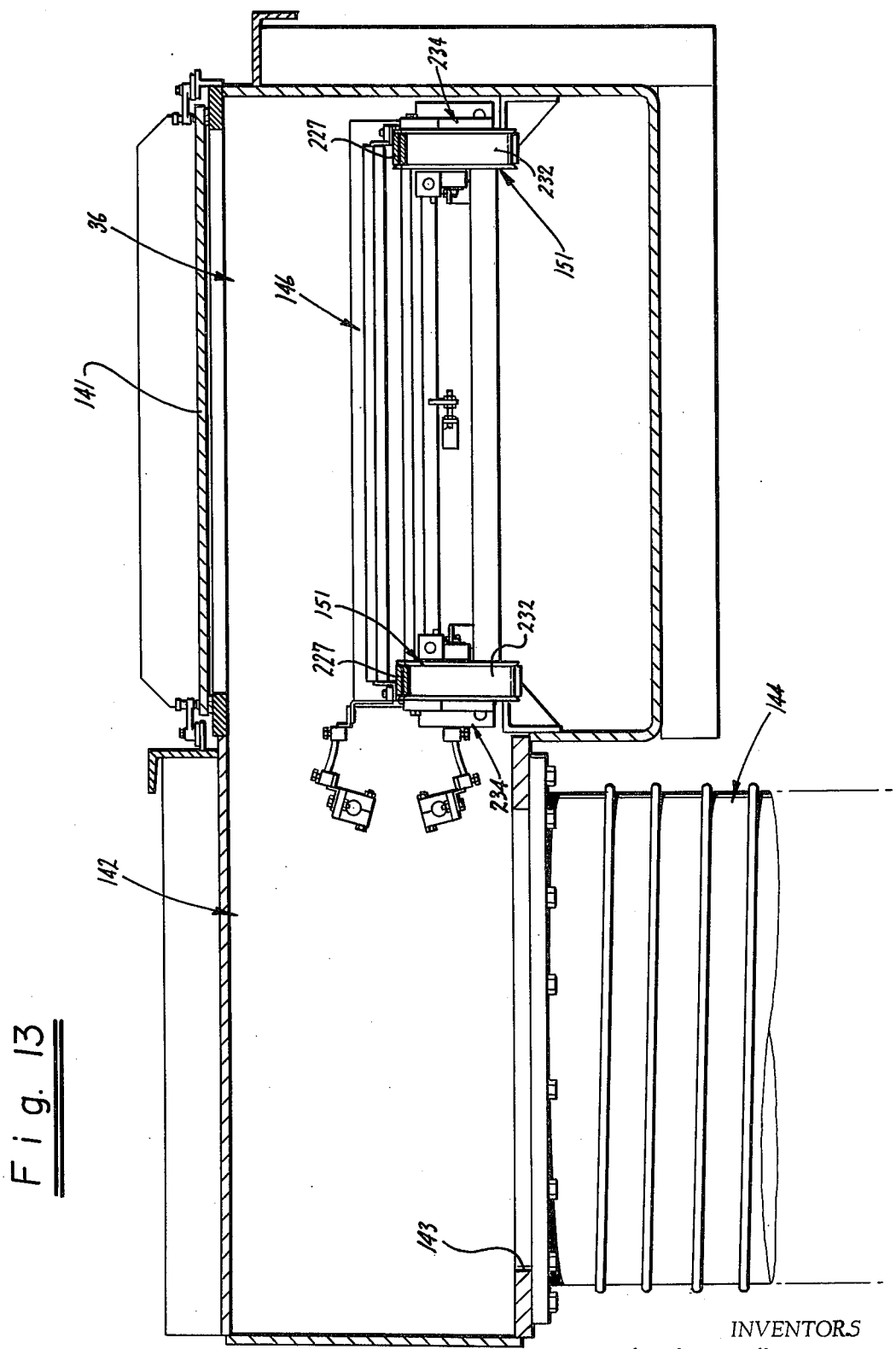

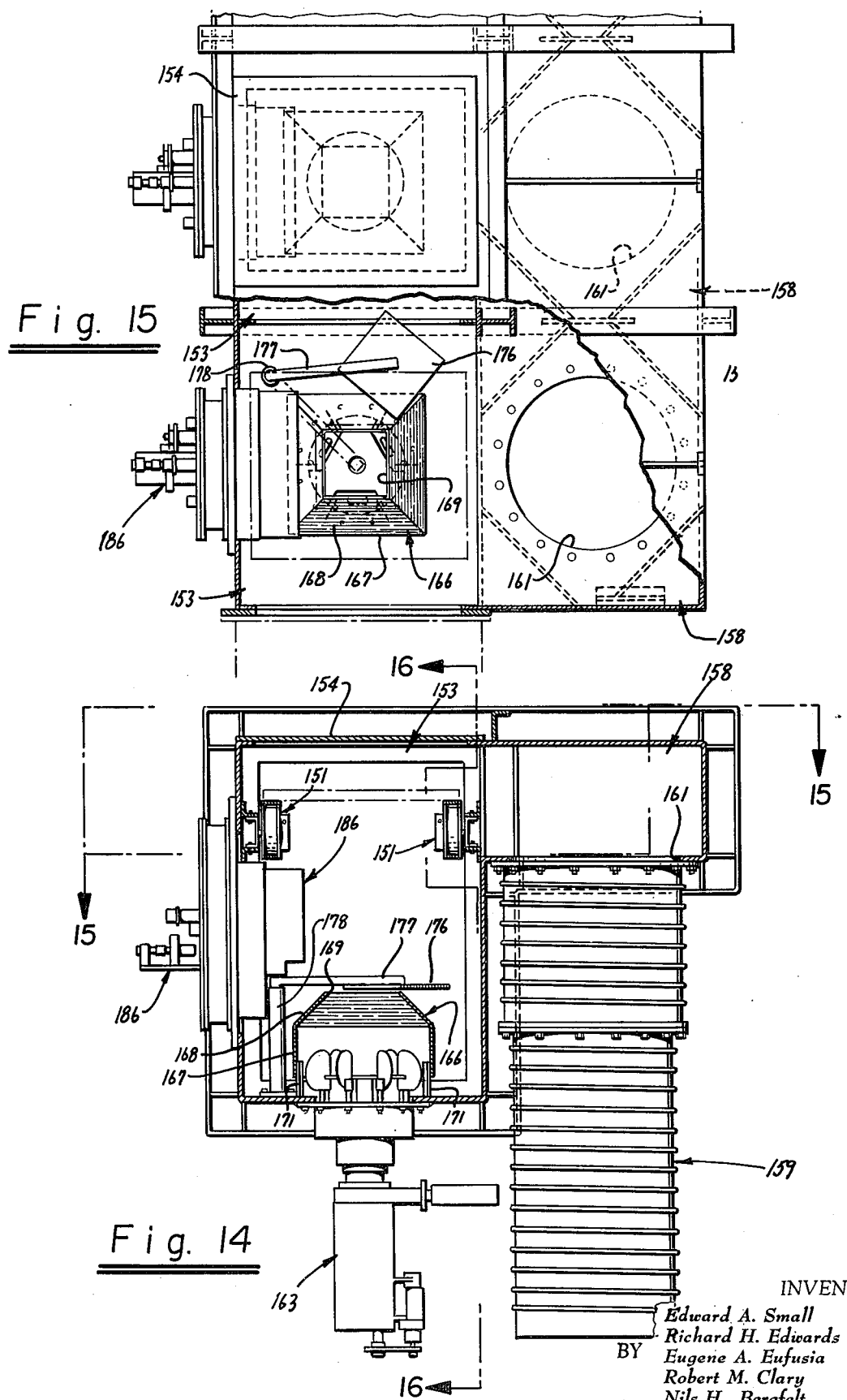

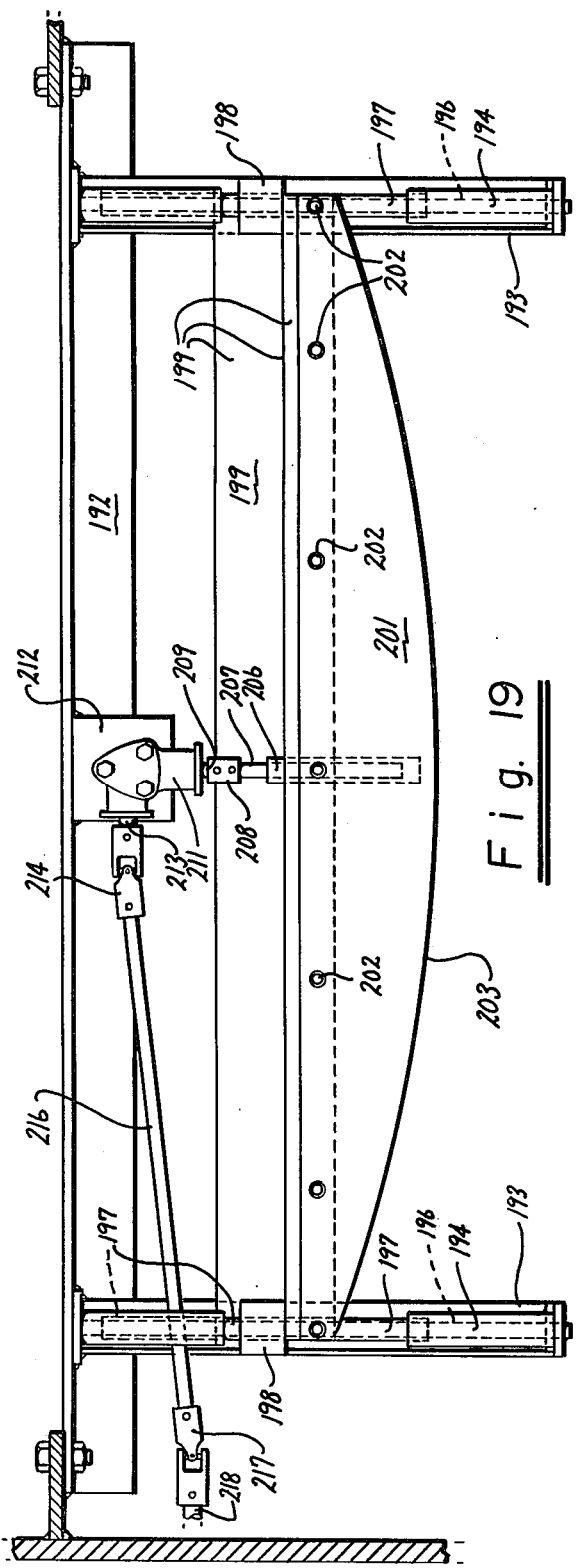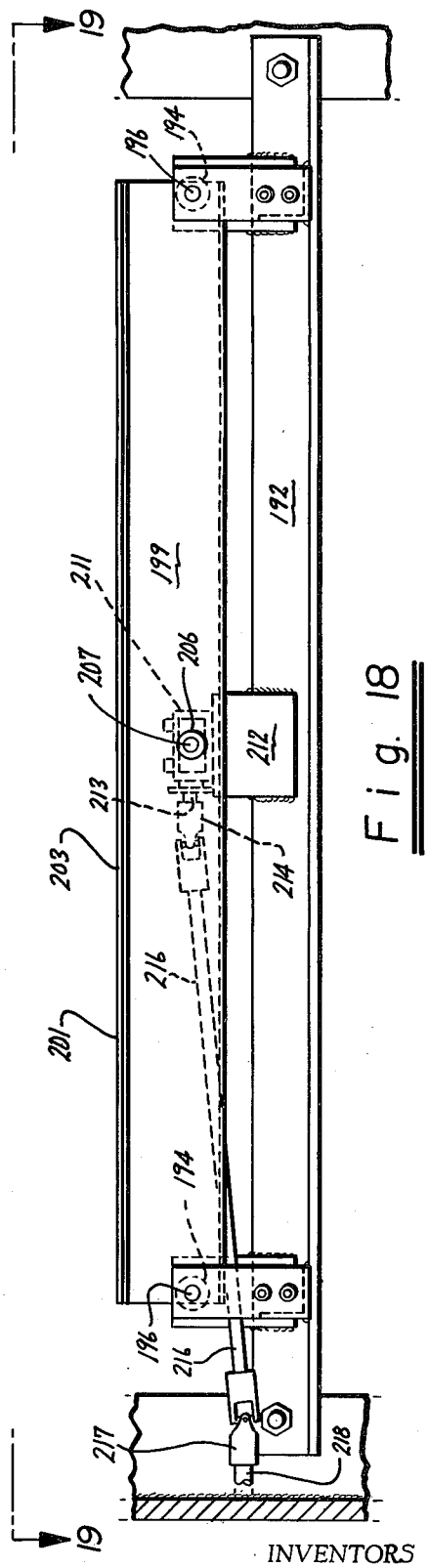

VAPOR DEPOSITION APPARATUS

This is a continuation of application Ser. No. 311,783 filed Dec. 4, 1972, now abandoned.

BACKGROUND OF THE INVENTION

In the June 1969 issue of Research/Development, there is an article appearing on page 42 entitled "The L-O-F Semicontinuous Thermal Evaporation Plant" in which there is described apparatus for depositing as many as three layers on the sheet of glass with the sheet of glass in a generally vertical position. This apparatus has a number of disadvantages such as the difficulty of providing suitable evaporation sources for evaporating onto vertical surfaces. In addition, such apparatus has lacked the desired versatility. There is, therefore, a need for a new and improved apparatus and method which can be utilized for coating large substrates.

SUMMARY OF THE INVENTION AND OBJECTS

The multi-layer coating apparatus is utilized for coating substrates carried by a frame. Means is provided which forms a coating chamber. Means is also provided which forms an entrance chamber and an exit chamber. Valve means is provided at the entrance and exit of each of the entrance and exit chambers. Conveyor means is provided for advancing the frames carrying the substrates with the substrates in a horizontal position through the entrance chamber, the coating chamber, the coating chamber and the exit chamber. Conveyor spacing means is provided for moving the frames rapidly into and out of the entrance and exit chambers and for preventing the frames from bumping into each other and for maintaining a predetermined spacing between the frames as they travel in the coating chamber.

In general, it is an object of the present invention to provide a multi-layer coating apparatus which can be utilized for applying multiple coatings economically and expeditiously to large substrates.

Another object of the invention is to provide an apparatus and system of the above character which can be substantially automatic.

Another object of the invention is to provide an apparatus and system of the above character in which precision control is maintained throughout.

Another object of the invention is to provide an apparatus and system of the above character in which heating of substrates takes place prior to the glow discharge cleaning.

Another object of the invention is to provide an apparatus and system of the above character in which the substrates, for example glass, are moved rapidly into and out of the entrance chamber and rapidly into and out of the exit chamber.

Another object of the invention is to provide an apparatus and system of the above character in which spacing means is provided for preventing the substrates from bumping into each other in the apparatus and for maintaining predetermined spacing between the substrates as they travel through the apparatus.

Another object of the invention is to provide an apparatus and system of the above character in which means is provided for maintaining pressure differentials between various chambers.

Another object of the invention is to provide an apparatus and system of the above character in which it is possible to maintain the substrate heated to a predetermined temperature in the various chambers and to apply coatings in the coating chamber at various desired temperatures.

Another object of the invention is to provide an apparatus and system of the above character in which the glass substrates travel in a horizontal position.

Another object of the invention is to provide an apparatus and system of the above character in which only the frames with the substrates carried thereby are advanced through the apparatus to make possible the use of small separation valves.

Another object of the invention is to provide an apparatus and system of the above character in which simplified conveyor systems are utilized which need only be driven from one position.

Another object of the invention is to provide an apparatus and system of the above character which makes it possible to utilize a combination heating and sealing duct means between the chambers.

Additional objects and features of the invention will appear from the following description in which the preferred embodiment is set forth in detail in conjunction with the accompanying drawing.

BRIEF DESCRIPTION OF THE DRAWING

FIG. 1 is a top plan view of a multi-layer coating apparatus and system incorporating the present invention.

FIG. 2 is a cross-sectional view taken along the line 2—2 of FIG. 1.

FIG. 3 is an enlarged detail view of the section of the apparatus bounded by the line 3—3 of FIG. 2 and particularly shows chamber A of the apparatus.

FIG. 4 is a cross-sectional view taken along the line 4—4 of FIG. 3.

FIG. 5 is a cross-sectional view taken along the line 5—5 of FIG. 4.

FIG. 9 is a cross-sectional view taken along the line 9—9 of FIG. 7.

FIG. 10 is an enlarged detailed view of the section of the apparatus shown in FIG. 2 bounded by the line 10—10 and particularly showing the chamber E.

FIG. 11 is a cross-sectional view taken along the line 11—11 of FIG. 10.

FIG. 13 is a cross-sectional view taken along the line 13—13 of FIG. 12.

FIG. 14 is a cross-sectional view taken along the line 14—14 of FIG. 12.

FIG. 15 is a top plan view of the portion of the apparatus shown in FIG. 14 with portions broken away.

FIG. 18 is an enlarged detail view of one of the masking assemblies in the apparatus.

FIG. 19 is a top plan view of the masking assembly looking along the line 19—19 of FIG. 18.

DESCRIPTION OF THE PREFERRED EMBODIMENT

Figure 6:
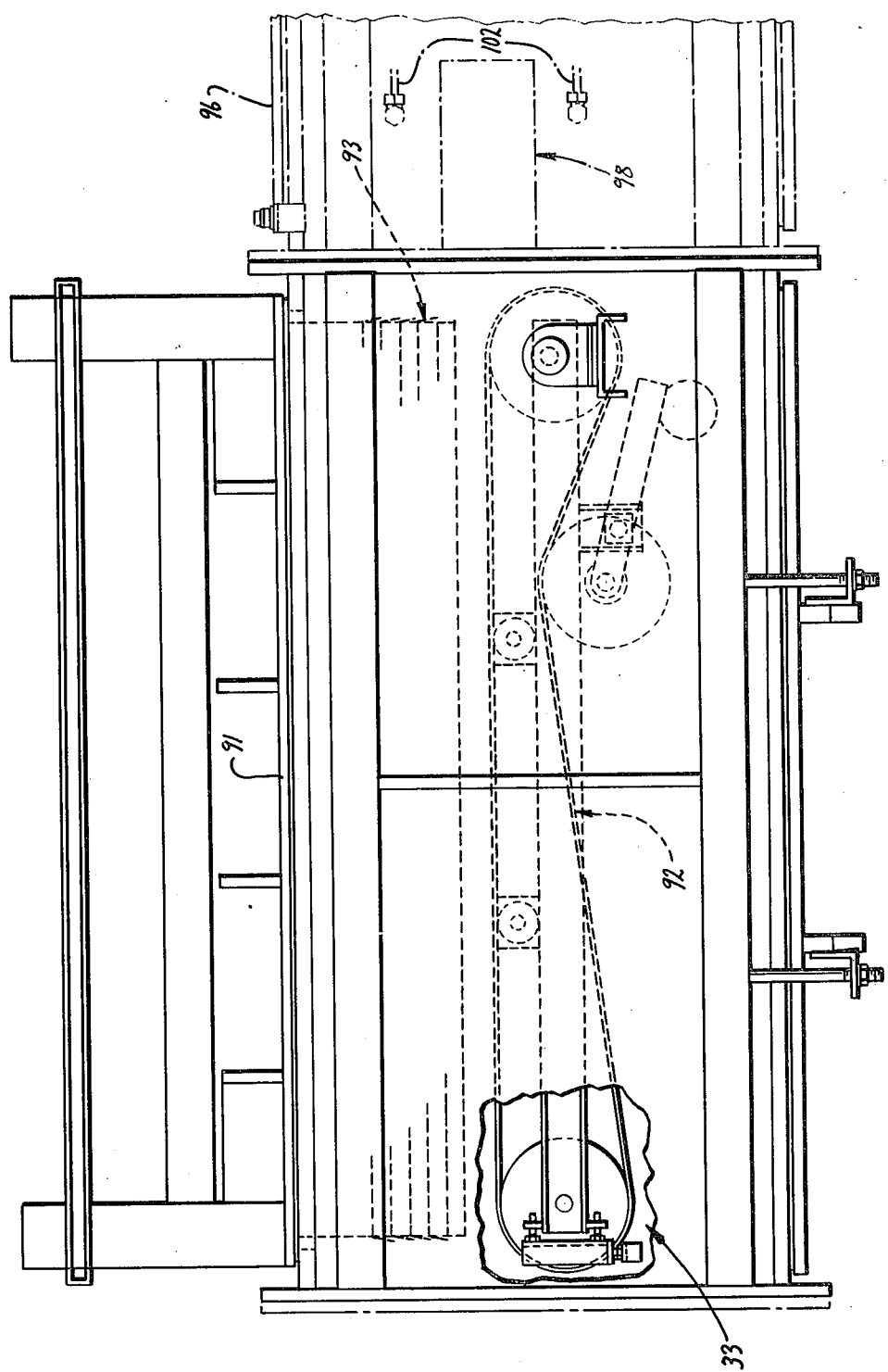
FIG. 6 is an enlarged detail view of the section of the apparatus shown in FIG. 2 bounded by the line 6—6 and particularly shows chamber C.
Figure 8:
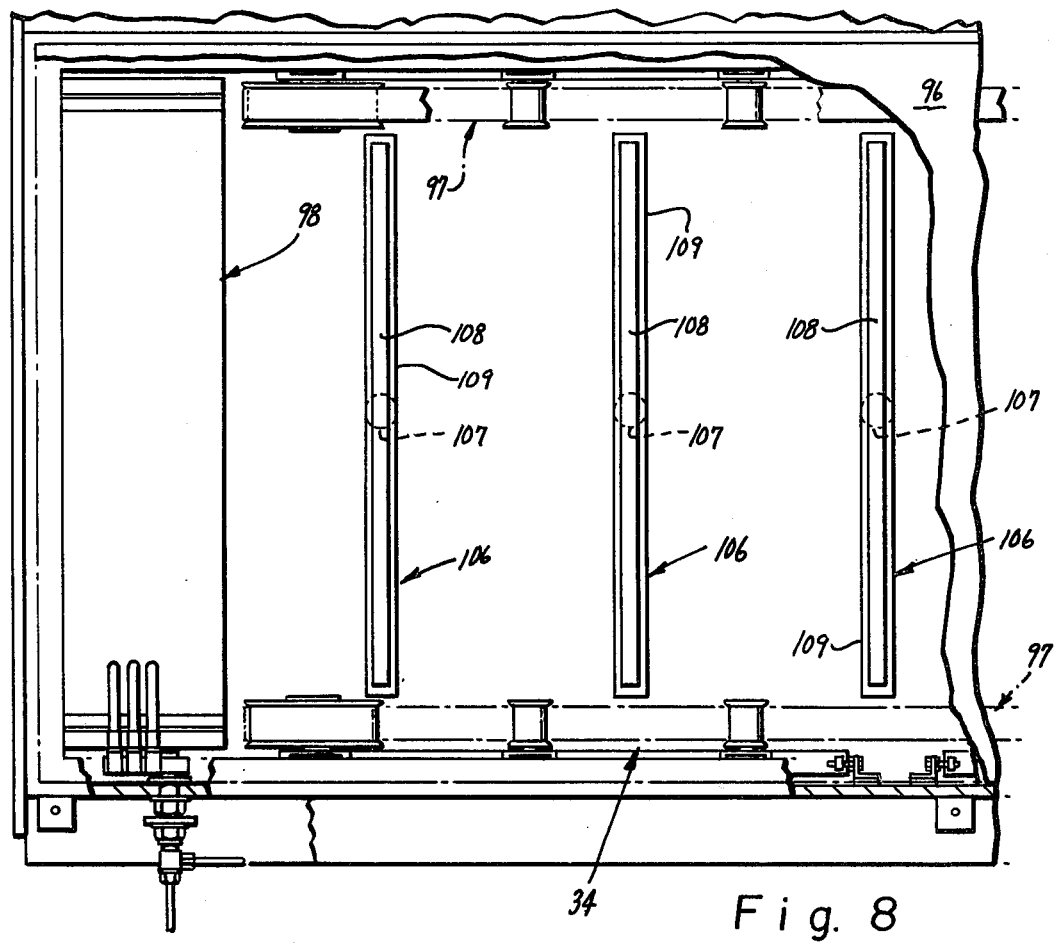
FIG. 8 is a cross-sectional view taken along the line 8—8 of FIG. 7.
Figure 7:
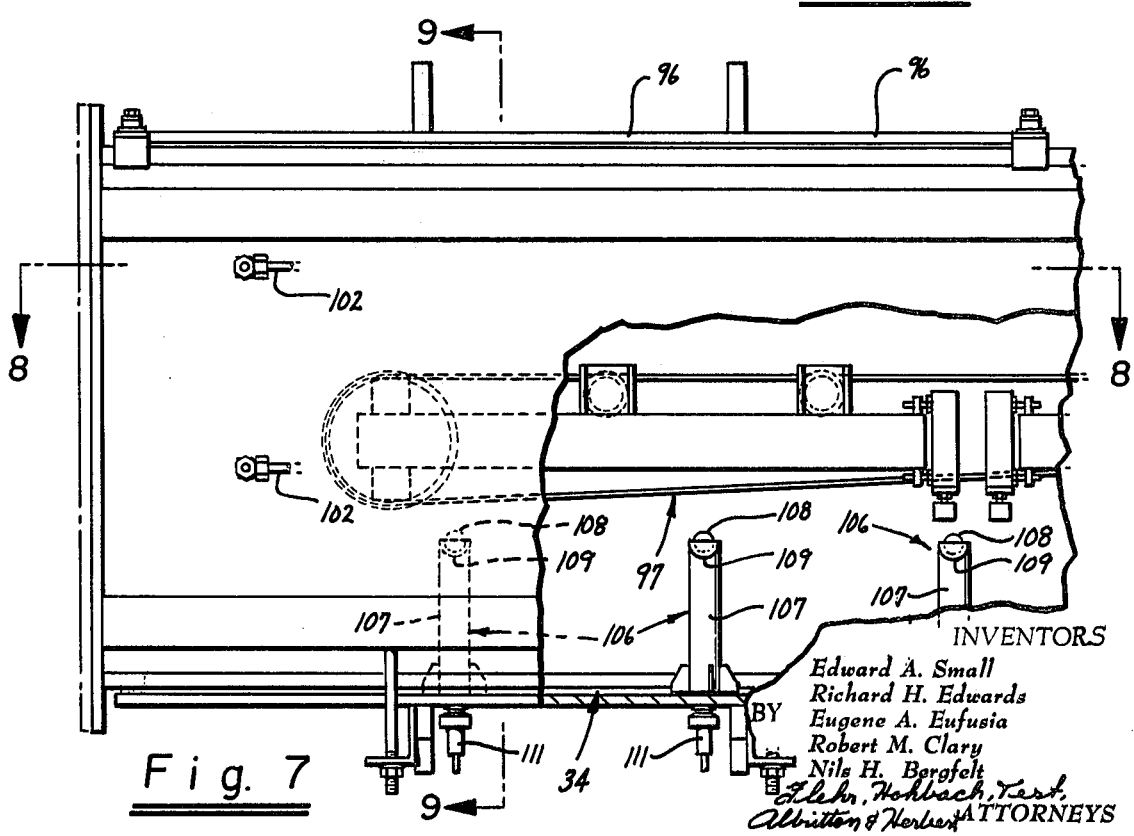
FIG. 7 is an enlarged detail view of the section of the apparatus shown in FIG. 2 bounded by the line 7—7 and particularly shows a portion of the chamber D.

A multi-layer coating apparatus and system which is shown in FIGS. 1 and 2 is particularly adapted for semicontinuous operation and for placing multiple layers on relatively large substrates of a suitable type such as large sheets of glass. The apparatus comprises a washer (not shown) which is utilized for washing the substrates which are to be coated so that they are absolutely clean before they are introduced into an entrance chamber A. The washer delivers the substrates, for example in the form of sheet glass to a loading elevator where it is mated with a frame and delivered to the loading conveyor 27. The loading conveyor 27 is adapted to deliver the substrates one by one to a very large coater 28. The coater 28 consists of a large fabricated framework 29 upon which there has been mounted a plurality of box-shaped enclosures 31–41. As can be seen, particularly from FIG. 2, enclosure 31 encloses chamber A, enclosure 32 encloses chamber B and so forth so that the enclosures 31 through 41 enclose chambers A through K, respectively.

A plurality of vacuum pumps of various types are associated with each of the enclosures so that each of the enclosures can be evacuated to the desired degree of vacuum as hereinafter described. Such vacuum pumping systems are conventional and have not been shown for all of the enclosures.

A large gate valve V1 is mounted at the entrance of the enclosure 31 and similarly a large gate valve V2 is mounted at the exit of the enclosure 31. It will be noted that the enclosure 31 has a height dimension which is substantially less than that of the other chambers. This is because the chamber 31 has been made as small as possible because the chamber A is vented to the atmosphere each time a new substrate is introduced into the chamber. For this reason it is desirable to keep the chamber as small as possible so as to reduce the time required to pump the chamber down to the desired vacuum.

A conveyor assembly 46 is mounted within the chamber A and consists of a pair of drive wheels 47 and 48 (FIGS. 3 to 5) which are rotatably mounted in the enclosure 31 on opposite sides of the same. The drive means for driving the drive wheels 47 and 48 consists of a dc motor 49 mounted exterior of the enclosure 31. The motor 49 drives a gear reduction unit 51 which is mounted upon the framework 29. The output shaft 52 of the gear reduction unit drives a slip clutch 53. The slip clutch 53 is connected to a shaft 54 which extends through a vacuum feed through 56 into the chamber A. The shaft 54 is connected to a bellows-type universal joint coupling 57. The coupling 57 drives the drive wheel 47. The drive wheel 47 is also connected to a universal-type coupling 58 which is connected to a shaft 59. The shaft 59 is connected to another bellows-type universal joint coupling 61 which is connected to the other drive wheel 48. These bellows-type couplings permit expansion and contraction of the shaft 59 without damaging the system. The drive wheels 47 and 48 drive two endless tapes 62 and 63 of a suitable type such as stainless steel. The drive wheels 47 and 48 are also formed of a suitable material such as stainless steel. The endless tapes or belts 62 and 63 travel over a pair of idlers 64 and 66 and then over large wheel 67. The desired tension is maintained on the tapes 62 and 63 by a large idler wheels 68 rotatably mounted on arms 69. The arms 69 are pivotally mounted at 71 on the enclosure and each is provided with a weight at the other end of the arm so that the idler wheels 68 are yieldably urged up into engagement with the bottom runs of the tapes 62 and 63 whereby the tapes will be driven by the associated drive wheels 47 or 48.

In order to further reduce the space within chamber A, the enclosure 31 is formed in such a manner that the bottom wall 74 extends upwardly between the two endless tapes 62 and 63 as can be seen particularly in FIGS. 3 and 5. The exit end of the chamber A is provided with an inclined bottom wall portion 74a in which a large pipe 76 is mounted which is connected to a source of vacuum (not shown).

The enclosure 31 is provided with an access opening 81 in the top side which is normally closed by a cover plate 82 which is held in place by clamps 83.

A microswitch MS-2 is mounted within the chamber A of the enclosure 31 and is provided for a purpose hereinafter described.

As can be seen from FIG. 2, the enclosures 32 and 33 of the coating apparatus are very similar and for that reason only a detailed view of the enclosure 33 is shown in FIG. 6. The enclosure 32 is provided with a removable cover plate 84. A conveyor assembly 86 of a type similar to the conveyor assembly 46 is provided within the chamber B of the enclosure 32. A conveyor spacer assembly 88 is mounted within the chamber B of the enclosure 32 and as shown in FIG. 2 is mounted adjacent the exit end of the chamber B.

The enclosure 33 also includes a removable top cover plate 91. A conveyor assembly 92 similar to the conveyor assemblies 86 and 46 is mounted within the chamber C.

The enclosure 34 is substantially larger than the enclosures 32 and 33 and is provided with a pair of removable cover plates 96. A conveyor assembly 97 is provided which is similar to the conveyor assemblies 46, 86 and 92 with the exception that it is provided with additional idlers similar to the idlers 64 and 66 in the conveyor assembly 46. A heated seal duct assembly 98 is mounted in the chamber D at the entrance to the chamber D in line with the top run of the conveyor assembly 97.

An electrical substrate heater assembly 93 (FIG. 6) is mounted within the chamber C at the top of the chamber and is of conventional type and is provided for raising the temperature of the substrate to the desired temperature for the coating process which is utilized in the apparatus. The heater assemby heats the substrate principally by radiation.

The heated seal duct assembly 98 is formed of a suitable high resistance material, such as stainless steel, and is formed to provide a relatively narrow duct or passage 99 (FIG. 9) which is only just large enough to permit the substrate to pass therethrough without contacting the seal duct assembly 98. The duct 99 serves to provide a high impedance to gas flow in the molecular flow range so that it is possible to create pressure differential from one chamber to another. In the present embodiment of the invention, these seal ducts are heated to maintain the pre-heat temperature on the glass or other substrate which is introduced in chamber C. Current at a low voltage is supplied to the heated duct assembly 98 through electrical feed-throughs 102 which extend into the chamber D and are connected to the duct assembly 98 as shown in FIG. 9. By making the duct a resistance element itself, it is possible for the duct assembly to serve two purposes. It is readily possible for such a heated duct to provide temperatures as high as 300° C. or above. The stainless steel which makes up the duct assembly 98 is relatively thin metal so that there is very little thermal heating required which makes it possible to reach equilibrium conditions rather quickly.

The chamber D can be termed the glow discharge chamber. The seal duct assembly 98 is provided at the entrance of the chamber so it is possible to maintain an atmosphere of some gas such as oxygen at a fixed pressure of 10 – 40 microns without the pressure being affected appreciably by the automatic cycling which occurs in chambers A and B as hereinafter described.

By maintaining the chamber D at a predetermined pressure it is possible to cause glow discharge cleaning of the substrate to take place. This glow discharge is accomplished by glow discharge electrode assemblies 106 which are spaced longitudinally on the chamber D. Such glow discharge assemblies are substantially conventional and generally consist of a T-shaped housing 107 which has an electrode 108 mounted therein. The electrode shield 109 is mounted on the housing and serves to direct the glow discharge. Each glow discharge assembly 106 is provided with a terminal 111 which is adapted to be connected to a source of high voltage.

Chamber E (FIGS. 10 and 11) which follows chamber D is divided up into four separate smaller chambers 116. The smaller chambers 116 are all accessible through a common cover plate 117 which forms a part of the enclosure 35 which forms the chamber E. Each of the individual chambers 116 of the chamber E is provided with an individual pump to obtain the desired pressure. In general, the pumps are operated so that the pressure progressively decreases in the chambers 116 from the left to the right of chamber E. Each of the chambers 116 is provided with an electrically heated seal duct assembly 118 which is identical to the heated seal duct assembly 98 hereinbefore described. The seal duct assemblies 118 are electrically isolated from the enclosure forming the chamber E and are heated by resistance heating so that the duct itself can transfer radiant energy to the substrate which is to be coated.

As can be seen particularly from FIG. 10, an endless conveyor assembly 119 for the chamber E is provided for moving the substrates which are to be coated in the apparatus through the chamber E. The conveyor assembly 119 consists of a motor 121 which is mounted upon a speed reducer 122. The speed reducer 122 is mounted upon a base 123 which is secured to the framework 29. The speed reducer 122 drives a sprocket 124 which drives an endless chain 126. The chain 126 drives a plurality of sprockets 127 which are mounted upon shafts 128. The shafts 128 extend through rotary feed-throughs 129 mounted upon the framework 29 and drive pairs of rollers 131 mounted on opposite sides of each of the chambers 116 in the chamber E. The rollers 131 are interconnected by connecting shafts 132. As can be seen from FIGS. 10 and 11, one pair of rollers is provided in each of the chambers 116 adjacent the exit end of the seal duct assembly 118 positioned therein. A chain-tightening sprocket assembly 136 is mounted on the framework 29 and is provided for maintaining the chain 126 in a relatively tight condition as particularly shown in FIGS. 10 and 11.

Figure 12:
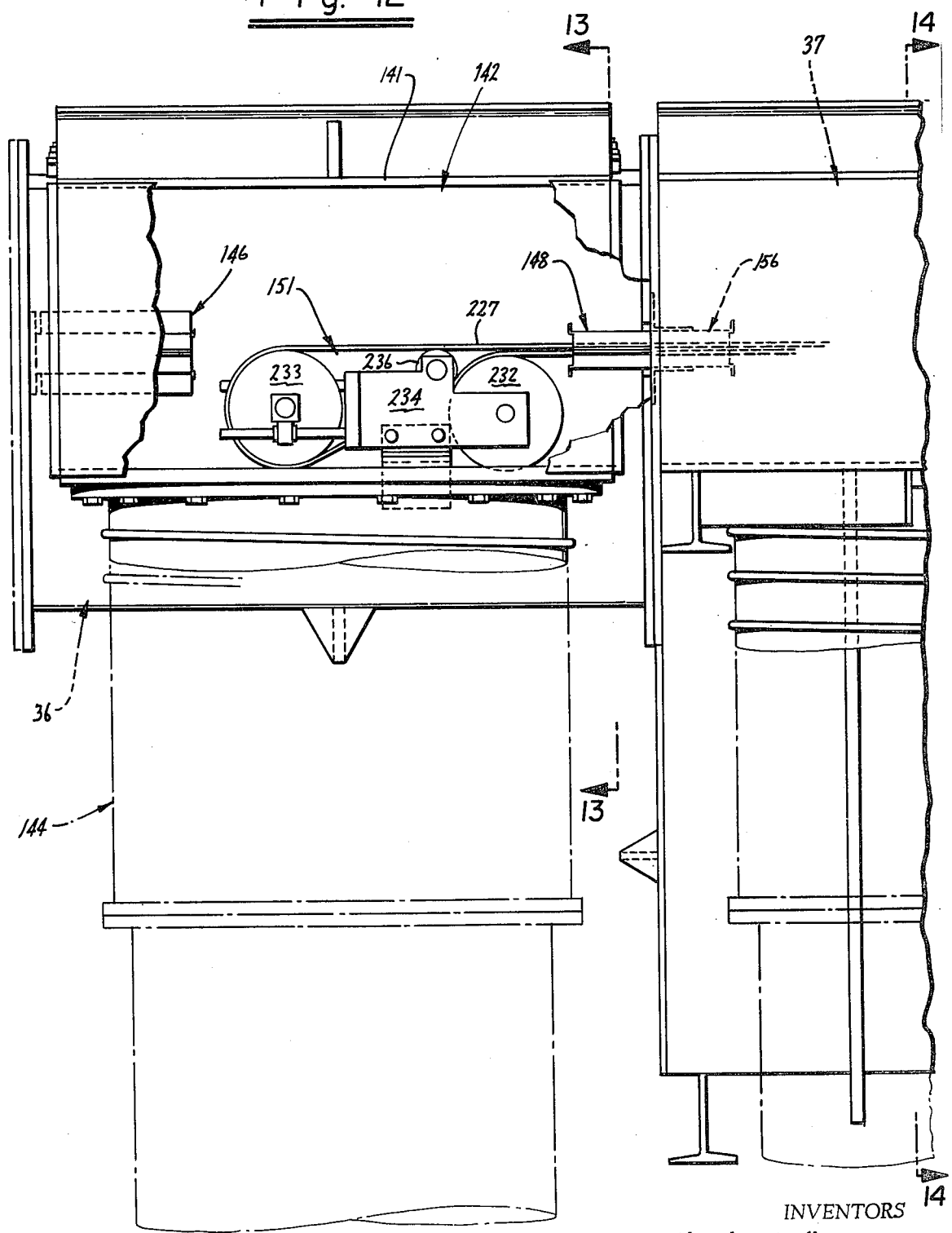
FIG. 12 is an enlarged detail view of the section of the apparatus shown in FIG. 2 bounded by the line 12—12 and particularly shows chamber F and a portion of chamber G.

Chamber F follows the chamber E. The enclosure 36 which forms the chamber F is also provided with a removable cover plate 141 to permit access to the chamber. The framework 29 is provided with an additional enclosure 142 which is in communication with the enclosure 36 as shown in FIGS. 12 and 13. The enclosure 142 is provided with a large opening 143 which is in communication with a large vacuum pump 144 of a conventional type. A heated seal duct assembly 146 is mounted at the entrance to the chamber F within the enclosure 36 of a type similar to the heated seal duct assembly 98. An additional unheated seal duct assembly 148 is provided in the chamber F and is mounted at the exit end thereof.

One end of an endless conveyor system 151 is mounted within the chamber F for advancing the substrates from the chamber F into the subsequent chamber G and will be described hereinafter.

Chamber G can be characterized as the main coating chamber which is formed of a plurality of sections or smaller chambers 153, each of which is provided with a removable cover plate 154. The number of sections or separate compartments in this main coating chamber G is determined by the number of successive layers it is desired to deposit upon the substrate. Thus, in the present embodiment of the apparatus, there are provided six separate chambers 153 for depositing six layers on the substrate.

Each of the sections 153 is provided with an unheated seal duct assembly 156 at the entrance end of the section and a similar assembly at the exit end of each section.

Any one of the sections 153 may be provided with a substrate heating system similar to that provided in chamber C mounted on the cover plate 154 for the purpose of heating the substrate. Heating may be carried out during coating or between application of coating layers if the heating function is substituted for the coating function in one or more sections.

As can be seen particularly from FIGS. 12 and 14, the enclosure 37 for the chamber G has a substantially greater depth than the preceding chambers. An additional enclosure 158 is provided for each of the similar chambers 153 within the chamber G and is in communication with the smaller chamber 153. Each section or smaller chamber 153 is provided with its own pressure control system. Thus, as shown, each is provided with its own vacuum pump 159 which is in communication with a large opening 161 provided in the enclosure 158.

Each of the smaller sections or chambers 153 is provided with its own evaporation source 163. The evaporation source can be of any suitable type. By way of example, as shown in the drawing, the evaporation sources 163 can be of the type described in U.S. Pat. No. 3,619,840. As pointed out therein, such evaporation sources are of the type which utilize an electron gun to evaporate or vaporize the material which is to be utilized for the particular layer on the substrate.

Figure 16:
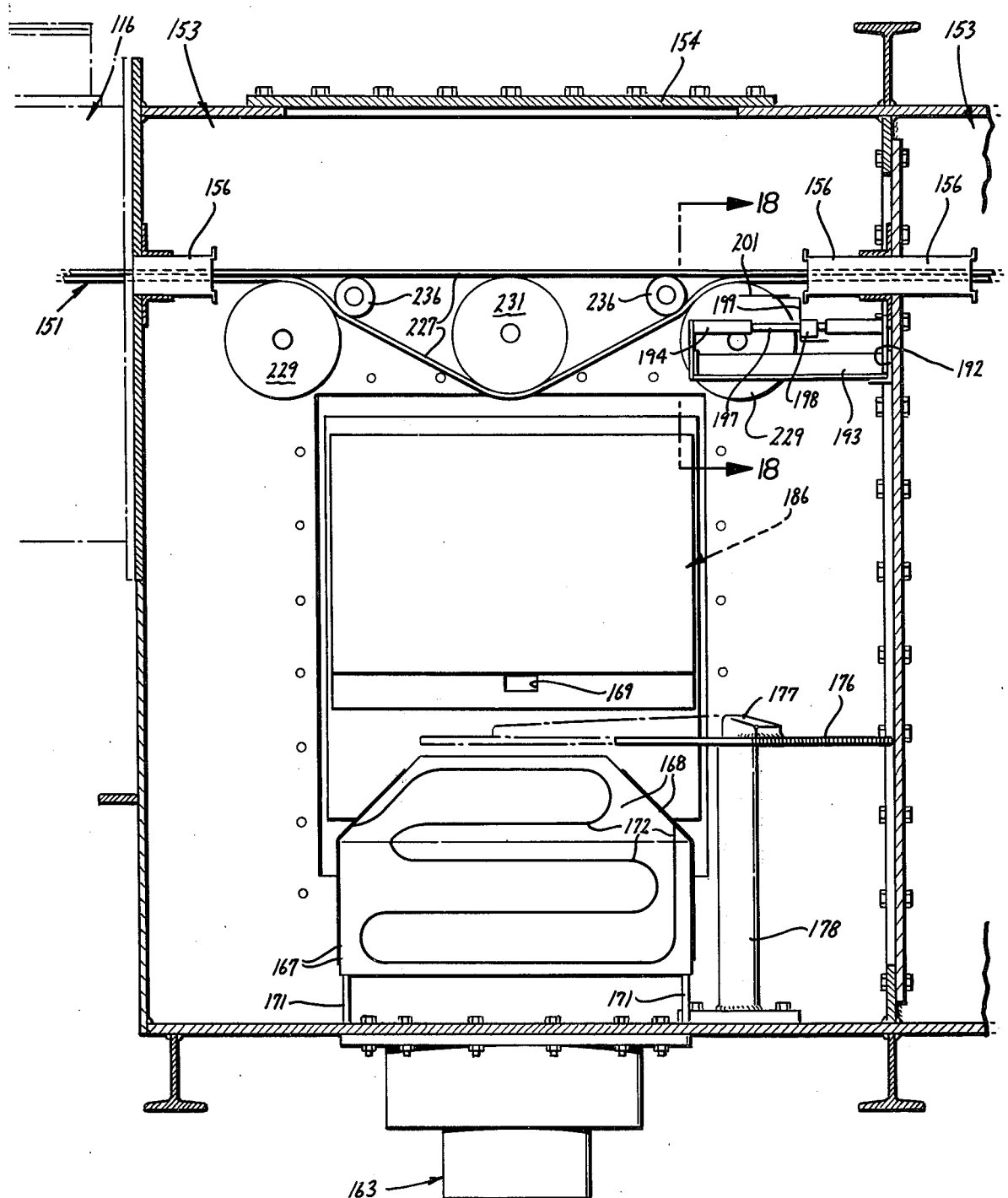
FIG. 16 is a cross-sectional view taken along the line 16—16 of FIG. 14.

Shielding means is provided for each of the evaporation sources 163 and consists of a removable four-sided shielding structure 166. the shielding structure 166 is formed of suitable good heat conducting material such as sheet copper in which each of the four sides is formed with a vertical side wall 167 and an inwardly inclined side wall 168. The inclined side walls 168 are formed so that there remains a rectangular opening 169 immediately overlying the central part of the evaporation source 163 as can be seen particularly in FIG. 15. The shielding structure 166 is provided with four legs 171 on the corners of the same so that the lower extremities of the walls 167 are positioned above the bottom wall of the enclosure 37. The shielding structure 166 also includes means for providing suitable cooling as, for example, tubing 172 welded on the outer surfaces of the walls 167 and 168 as shown particularly in FIG. 16. During operation of the apparatus, cooling water is passed through the cooling coils 172.

The shielding means also includes a shielding member 176 which has a size which is sufficiently large to cover the opening 169. It also can be called a spatter shield. This shielding member 176 is mounted upon an arm 177 which is pivotally mounted in a sleeve 178 secured to the enclosure 37. Means is provided for moving the shielding member 176 from a position in which it overlies the shielding structure 166 and covers the opening 169 in an out-of-the-way position such as that shown in FIG. 15 and consists of lever means (not shown) of a conventional type.

Each section or chamber 153 of the coating chamber G is provided with an evaporation rate monitor 186 of a suitable type, for example, an evaporation rate monitor of the type described in U.S. Pat. No. 3,773,548 can be utilized herein. The evaporation rate monitor 186 is adapted to receive a small portion of the evaporated stream of material passing up through the opening 169 in the shielding structure 166 through an opening 187. As hereinafter explained, the evaporation rate monitor 186 is utilized for controlling the rate of evaporation from the evaporation source 163.

Each of the sections or chambers 153 is also provided with means for controlling the distribution of the coating material on the glass or other substrates so that a uniform distribution is obtained Such means consists of a shielding assembly 191. As shown particularly in FIGS. 18 and 19, such shielding assemblies consist of a support member 192 which is secured to the framework 29 within the chamber. As can be seen particularly in FIG. 18 the support member 192 extends horizontally across the chamber. A pair of U-shaped brackets 193 are mounted on opposite ends of the support member 192 and have a pair of sleeves 194 mounted thereon in such a manner that they face each other. A rod 196 extends through the sleeves 194 and has mounted thereon another sleeve 197 which extends in through the sleeves 194. A collar 198 is slidably mounted on each of the sleeves 197. A Z-shaped plate 199 is secured to the two collars 198 and is also slidably mounted upon the sleeve 197. A shielding member 201 is secured to the Z-shaped plate or member 199 by suitable means such as screws 202. The shielding member is provided with an arcuate convex forward edge 203 which extends in a direction laterally of the chamber.

Means is provided for advancing the shielding member 201 into the chamber in which it is mounted and consists of an internally threaded sleeve 206 which is secured to the Z-shaped member 199. A threaded rod 207 is threaded into the sleeve 206 and is connected by a coupling 208 to the output shaft 209 of a right-angle gear unit 211. The gear unit 211 is mounted upon a bracket 212 secured to the support member 192. The input shaft 213 of the gear unit is connected to a universal joint 214. The universal joint 214 is connected by a shaft 216 to another universal joint 217. The joint 217 is connected to another shaft 218 which extends outside of the enclosure in which it is mounted where it is adapted to be engaged by a crank (not shown) so that by rotation of the shaft 216, the shielding member 201 can be extended or retracted to the desired position.

As can be seen from FIG. 2, the same endless conveyor advancing assembly is provided throughout the main coating chamber G and extends into the chamber H. The construction of the enclosure 38 for the chamber H is very similar to that for the enclosure 36 for the chamber F. Thus, it is provided with a removable cover plate 221. It is also provided with a seal duct assembly 222 which corresponds to the unheated seal duct assembly 148 in the chamber F. However, it is provided with a water cooled seal duct assembly 223. The purpose of the water cooling on the duct is to provide a means of cooling the glass substrate by radiation so as to reduce the thermal shock when exiting to atmosphere. As can be seen from FIG. 2, the endless conveyor assembly 151 also extends into the chamber H. The endless conveyor assembly 151 is similar to the ones hereinbefore described. It is provided with a pair of driving rollers 226 which are driven by an electric motor and speed reducer (not shown) of the type hereinbefore described. The driving rollers 226 are interconnected in the same manner as the other endless conveyors hereinbefore described. They drive two endless tapes 227 formed of a suitable material such as stainless steel. As can be seen, the tapes 227 travel over rollers 228 in the chamber H and then travel over rollers 229 and under rollers 231 in each of the sections 153 of chamber G. The tapes then travel over rollers 232 in chamber F and around a roller 233 in chamber F. The rollers 232 and 233 are rotatably mounted in tape-tightening assemblies 234. A pair of additional small rollers 236 are provided on each of the sections 153 of the chamber G adjacent the rollers 229 as shown particularly in FIG. 16.

From the arrangement which is shown in FIG. 2, it can be seen that the upper run of the tapes 227 are supported by the smaller rollers 236 and by large rollers 231 intermediate the same. It can be seen that at the entrance and exit ends of each of the sections 153 of the chamber G that the upper and lower runs of the tapes are brought together so that they can travel through the relatively shallow unheated seal duct assemblies 156.

The chamber I which is next to the chamber H is divided into two sections 241. A common removable cover plate 242 is provided as a part of the enclosure 39 for the chamber I. Water cooled seal duct assemblies 243 are provided on the exit end of the sections 241 and are similar to the water cooled seal duct assemblies 223 provided in section H. A conveyor assembly (not shown) very similar to that which is utilized in chamber E is provided within the chamber I.

Chamber J which follows chamber I is very similar to chamber B. The enclosure 40 for this chamber includes a removable cover plate 246. It also includes a conveyor assembly 247 mounted within the chamber which is substantially identical to the endless conveyor assembly 86 provided in chamber B. A gate valve V3 is provided at the exit end of the chamber J and is identical to the valve V2 provided at the entrance end of chamber B. Chamber K which follows the gate valve V3 is substantially identical to chamber A. The enclosure 41 for this chamber is provided with a removable cover plate 249. It is also provided with an endless conveyor 251 which is substantially identical to the endless conveyor 46 provided in chamber A. A gate valve V4, similar to the gate valve V1, is provided at the exit end of the chamber K. An endless conveyor assembly 252 is provided on the exit side of the valve V4 and is adapted to supply the substrates as they exit from the chamber K into a down elevator assembly 253. Microswitches (not shown) are provided in chamber J. Their positions and functions are hereinafter described.

Figure 17:
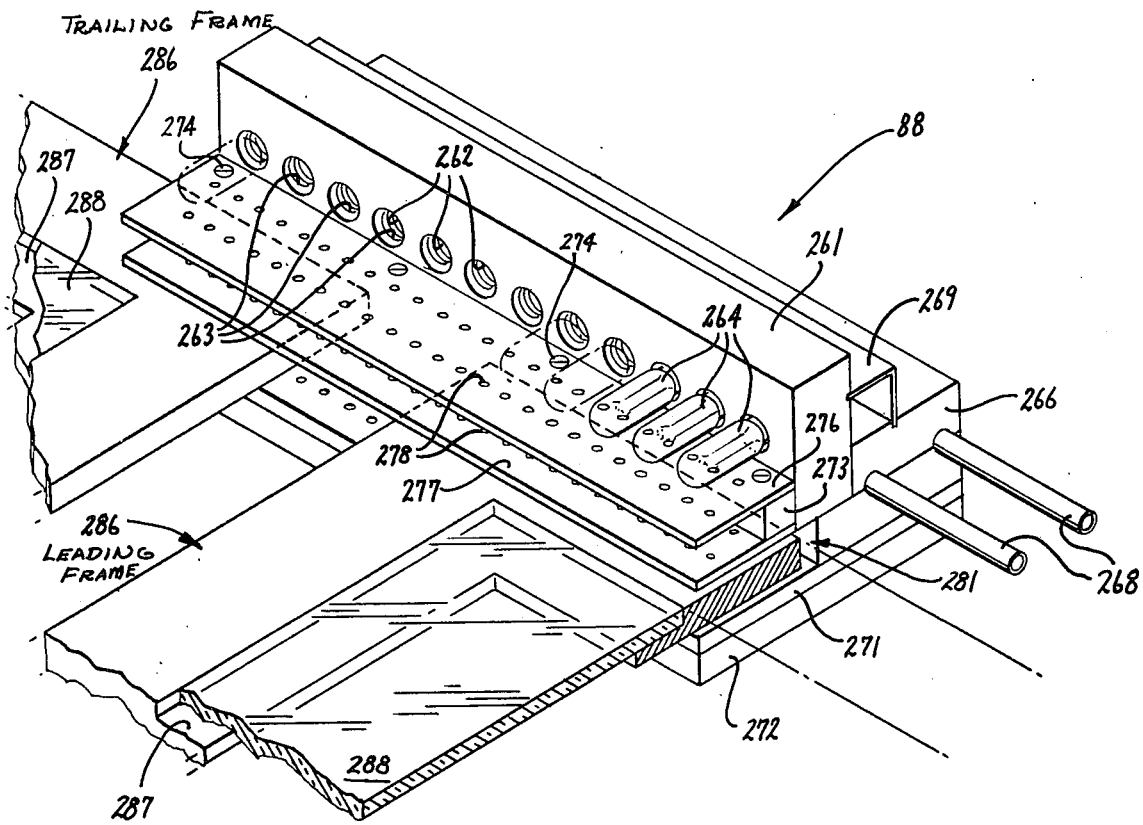
FIG. 17 is an isometric view of the conveyor spacer mechanism which is utilized in the apparatus and system.

A portion of the conveyor spacer assembly 88 which is shown in chamber B is shown in detail in FIG. 17. As shown therein, it consists of a lamp housing 261 having a plurality of bores 262 extending therethrough. A lamp socket 263 is mounted within each of the bores and is adapted to receive a lamp 264. The lamp housing 261 is mounted upon upper and lower cooling blocks which have cooling channels (not shown) provided therein which are in communication with tubes 268. A lamp socket cover 269 is mounted on the upper cooling block 266 and on lamp housing 261. A printed circuit board housing 271 is mounted upon the lower cooling block 267 and has mounted therein a printed circuit board (not shown) which carries the circuitry as hereinafter described for the conveyor spacer assembly 88. A cover plate 272 is provided for covering the printed circuit housing 271. A spacer block 273 is secured to the lamp housing 261 and has mounted thereon, by suitable means such as screws 274, upper and lower aperture plates 276 and 277. As can be seen, the aperture plates are spaced and parallel and are provided with a plurality of apertures or openings 278 which are arranged in two rows in such a manner that the apertures in the top plate 276 are in registration with the apertures in the bottom plate 277. The apertures 278 in the aperture plates 276 and 277 are arranged so that with the apertures in the two rows being offset with respect to each other that there are in effect 47 light beams created thereby utilizing the light from the lamps 264. The 47 holes are placed in two separate rows so that there will not be interference between one photocell to the next. Each of these light beams is adapted to light a photocell carried by the printed circuit board housing 271. Each photocell forms a part of the electrical circuit carried by the printed circuit board mounted in the printed circuit housing.

The upper and lower plates 276 and 277 form a collimating system for each of the 47 light beams which are provided. The combination of the lamp housing block 261, the top aperture plate 276 and a lamp cover (not shown) form a light integrating chamber which uniformly illuminates the 47 holes in the top aperture plate. Because an integrating light chamber is utilized, approximately 20 to 30% of the lamp bulbs which are utilized can burn out without degrading the operation of the system.

A U-shaped recess 281 is provided between the lower aperture plate 277 and the top of the printed circuit board housing 271 and is of such a dimension that it is able to receive and permit rectangular frames 286 to pass therethrough. The frames 286 can be formed of any suitable material such as aluminum. As can be seen from FIG. 17, the frames 286 are provided with a rectangular recess 287 in the upper surface adjacent the inner margin of the frame which is sized so that it is adapted to receive the glass substrate 288 which are to be coated in the apparatus.

The circuitry which is used is provided on a printed circuit board (not shown). The printed circuit board is mounted in the printed circuit board housing 271 and forms a part of the conveyor spacer assembly shown schematically in FIG. 20.

The overall apparatus includes additional electronics much of which is conventional and which is represented in FIG. 1. Thus, there are provided a plurality of consoles 291, one for each of the sections 153 of the chamber G for controlling the operation of the evaporation sources 163 hereinbefore described. Similarly, there are provided additional control consoles 292 and 293 for automatically controlling other portions of the apparatus as hereinafter described.

The conveyor spacer assembly 88 is water-cooled so that it can be readily operated within a vacuum chamber as, for example, the chamber B.

Operation of the multi-layer coating apparatus and system in performing the present method may now be briefly described as follows. Let is be assumed that it is desired to coat a plurality of substrates of relatively large size with the multi-layer coating apparatus and system. By way of example, let it be assumed that the substrates are glass and that they have been pre-cut to a predetermined size as, for example, 32¾ by 50¾". With such a size, it is possible to provide finished coated pieces of glass which have a size 30 inches × 48 inches. The sheets of glass are passed through a washing machine which may be of a conventional type which washes both sides of the glass and rinses the same. Thereafter, the remaining moisture on both sides is blown off. It is the bottom side of the glass that is to be coated. This surface will not be touched during passage through the apparatus, as hereinafter described, by rollers conveyor belts and the like. With the glass dry and at a temperature ranging from 80° to 90° F., the glass substrates are loaded into frames 286 which are positioned in a horizontal manner and with the glass placed in the recesses 287 provided in the frames. The glass in the frames 286 is loaded into an elevator (not shown) and raised so that it can be moved onto the inlet conveyor 27 where it is in a position to be introduced into the entrance chamber A.

When the apparatus is ready to receive the next sheet of glass mounted of the frame 286, the valve V1 is opened, and the conveyor 27 is placed in operation. The frame 286 bridges the gap through the entrance valve V1 and moves at a relatively rapid rate as, for example, a rate of 72 ft. per minute. As soon as the frame 286 strikes the microswitch MS-2, the endless conveyor 46 within the chamber A is stopped. Thereafter, the gate valve V1 is closed and the pumping system for chamber A is immediately actuated and the chamber is pumped down relatively rapidly to a suitable pressure as, for example, 50 microns. As soon as this pressure is attained in chamber A and the first of the 47 light beams, in the conveyor spacer assembly 88, is clear the valve V2 opens. The endless conveyors 46 and 86 in the chambers A and B are then started and travel at approximately the same rate of speed as, for example, 72 ft. per minute. The frame 286 is thus passed quickly from chamber A into chamber B. This movement continues until the frame from chamber A closely approaches the last frame which previously had entered into chamber B. As herein after explained, this last frame 286 in chamber B which preceded the frame being moved from chamber A is moving at a much slower predetermined rate of speed as, for example, a rate from 2 to 4 ft. per minute depending upon the process parameters being utilized. In order to prevent the frame which is leaving chamber A from bumping into the rear end of the preceding frame, the conveyor spacer assembly 88 is provided which automatically controls the conveyor in chamber B so that a predetermined space is provided between the frames as, for example, a space of one-half inch. When the proper spacing has been obtained, then the conveyor in chamber B will be slowed down so that the frame which has been advanced out of chamber A will continue through the chamber B at the same rate of speed that the preceding frame is being advanced. From this point on, the frame which has been advanced out of chamber A will follow the preceding frames and will travel at the same rate of speed as the preceding frames until near the exit end of the apparatus as hereinafter described In other words, it can be seen that the purpose of the conveyor spacer assembly is to adjust the spacing between two frames travelling at different speeds on two conveyors within an apparatus to a predetermined spacing and then to adjust the speed of one of the conveyors to match the speed of the other conveyor so that the predetermined spacing will remain constant thereafter.

Figure 20:
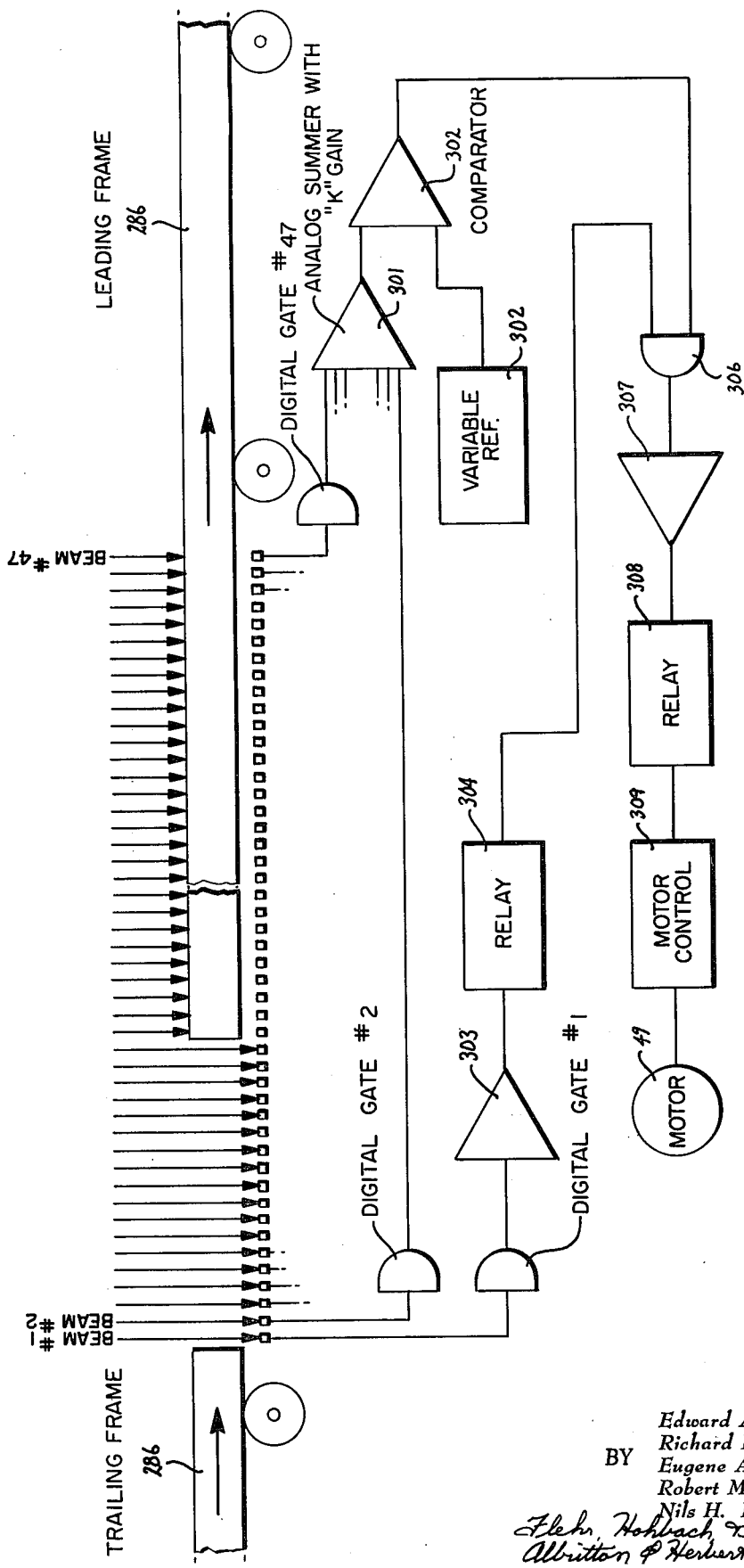
FIG. 20 is a schematic circuit diagram showing the electronics utilized for operation of the conveyor advancing assembly.

In the conveyor spacer assembly which is shown in detail in FIGS. 17 and 20, the printed circuit in housing 271 supplies zero volts out when the photocell is illuminated by its light beam. Thus, the photocell with its associated circuitry can be termed a digital gate as shown in FIG. 20. Thus, there are provided digital gates numbered from 1 – 47. The portion of this assembly which measures the spacing between two frames 286 is the digital gates 2 – 47 and their associated photocells, light beams and the like. The output of the digital gates 2 – 47 are fed into an analog summer 301 with a gain of K. The function of this analog summer is to supply an output voltage which is proportional to the number of cells 2 – 47 that are illuminated. The gain of K is such that the output is approximately 10 volts when all of the cells 2 – 47 are illuminated. When all the cells 2 – 47 are dark, the output of the analog summer 301 is zero volts. If half of the cells are illuminated, the output is 5 volts, and so on. Thus, it can be seen that the output of the analog summer 301 changes in increments equal to 1/46 of 10 volts and that no voltages between these increments are obtainable. This is because the output of the digital gates 2 – 46 is either zero or −30 volts. A step variable reference 302 is provided which consists of a voltage divider whose output can be changed in increments equal to the 46 output levels of the analog summer. This variable reference 302 is used to adjust the spacing between the leading frame and the trailing frame entering the conveyor spacer assembly 88.

The output of the analog summer 301 is supplied to a comparator 302 which receives its reference from the variable reference 302. When the output level of the analog summer 301 is greater than the output from the variable reference 302, the output of the comparator is one predetermined value and when the output of the analog summer 301 is less than the output of the variable reference 302, the output of the comparator 302 is a different predetermined value as, for example, the two values can be −15 volts and +15 volts approximately, respectively.

The photocell No. 1 operates a digital gate No. 1 in the same manner in which digital gates No. 2 – 47 are operated. The outut of digital gate 1 supplies its output to a buffer amplifier 303. The output of buffer amplifier 303 is supplied to a relay 304. Relay 304 is energized when the light beam is shining on photocell 1 and is deenergized when the photocell 1 is dark. Relay 304 supplies a −15 volts to an OR gate 306 when the relay 304 is energized and supplies zero volts to the OR gate 306 when the relay 304 is deenergized. The output of the comparator 302 supplies the second input to the OR gate 306. The output of the OR gate 306 is supplied to a buffer amplifier 307 and the output of the buffer amplifier 307 is supplied to a relay 308. Relay 308 is energized when either of the two inputs to the OR gate 306 is at a predetermined voltage as, for example, a −15 volts. Relay 308 will be deenergized when both the inputs to the OR gate 306 are at zero volts or positive. The output of the relay 308 is connected to a motor control 309 which is connected to the motor 49 for the conveyor assembly 86 in chamber B.

When the relay 308 is energized, the conveyor 86 runs fast and when relay 308 is deenergized, conveyor 86 runs slow. When conveyor 86 is running slow, it is running at the same speed as conveyor 92. The conveyor 92 always runs slow. By way of example, when conveyor 86 is running fast, it must run fast enough so that trailing frame 286 which is carried by it will travel at least 5 ft. in the same amount of time that it takes the leading frame 286 on the conveyor 92 to travel approximately 1 ft. This is necessary because the leading frame 286 is approximately 5 ft. ahead of the trailing frame 286 when the trailing edge of the leading frame 286 has travelled past the light beam for photocell 1.

Let it be assumed to further explain the operation of the conveyor spacer assembly 88 that the apparatus is operating but there are no frames on the conveyor system. When the first frame 286 carrying a substrate enters onto the conveyor 86 in chamber B, the conveyor assembly 86 will be operating in the fast mode because all of the light beams 1 – 47 are illuminating their respective photocells 1 – 47. As soon as the leading edge of the frame 286 passes through light beam No. 1, photocell No. 1 will be darkened and relay 304 will be deenergized. Relay 304 supplies one of the inputs to the OR gate and this input will be zero. However, the other input to the OR gate is a logic one or a −15 volts and, therefore, the output to the OR gate will be a logic one and cause the motor for the conveyor 86 to continue running fast.

At this time the desired spacing to be used between the frames is chosen and this is set into the system by adjusting the variable reference 302 in the manner hereinbefore described. By way of example, the desired spacing can be anything from zero to a predetermined dimension as, for example, 11¾ inches. Let it be assumed that a spacing of one inch is desired which would be equivalent to all but four of the light beams being covered by the frames 286 as they are being advanced through the apparatus.

As the leading edge of the first frame 286 continues to travel through the light beams until all but the last four light beams, that is, light beams 44–47 are blocked, then the output of the analog summer 308 will drop below the reference level from the reference 302 and the output to the comparator will go to a +15 volts which is a logic zero for the OR gate 306. At this time, both inputs to the OR gate will be a logic zero and relay 308 will be deenergized causing the motor 49 to transfer from high speed to low speed operation. Thereafter the first frame 286 will continue to travel through the remaining light beams of the conveyor spacer assembly 88 at slow speed. When the trailing edge of the first frame No. 286 clears the light beam No. 1, light will illuminate photocell No. 1 causing relay 304 to be energized. When relay 304 is energized, a logic one will be fed into the OR gate 306 which causes a logic one to be supplied to the relay 308 to energize it and to cause the conveyor 86 to transfer back to high speed operation.

When relay 304 is energized, and assuming that the other conditions required in the apparatus have been met, the valve V2 will open and as hereinbefore described, the conveyor assembly 46 in chamber A will be placed in operation to rapidly advance the frame carrying a substrate onto the conveyor assembly 86 in chamber B which is travelling at its fast speed. The frame 286 which it is carrying will catch up rapidly with the preceding frame 286 which is being carried by the conveyor assembly 92 and before the trailing edge of the preceding frame 286 leaves the conveyor spacer assembly 88. When the leading edge of the trailing frame 286 passes through light beam No. 1, photocell No. 1 will become dark and relay 304 will be deenergized thus causing one of the inputs to the OR gate 306 to go to a logic zero. However, since the preceding frame 286 has travelled more than four light beams that were chosen previously by the time the trailing frame passes through light beam No. 1, the other input to the OR gate 306 will be at a logic one and relay 308 will be energized. Thus, the motor 49 for the conveyor 86 will continue running in its fast mode. This will continue until all except any four of the photocells are illuminated. At this time, the output of the analog summer 301 will drop below the reference level supplied by the reference 302 and the other input to the OR gate 306 will be logic zero. At this time both inputs to the OR gate 306 are at logic zero which will cause relay 308 to be deenergized and the motor 49 for the conveyor 86 to transfer to slow speed operation which, as pointed out previously, is the same speed as the speed of the conveyor assembly 92. Thereafter the preceding and trailing frames 286 will travel at the same rate of speed with a one inch spacing between the same. When the trailing edge of the trailing frame 286 passes through light beam No. 1, conveyor 86 will again transfer to fast speed operation and trigger another frame to be advanced from chamber onto the conveyor 86. This next frame will be advanced at high speed until it comes within one inch of the preceding frame, at which time the conveyor 86 will return to slow speed operation in the manner hereinbefore described.

Thus, it can be seen that conveyor spacer assembly 88 prevents the frames from bumping into each other and makes it possible to rapidly accelerate frames out of chamber A so that valve V2 need only remain open for very short periods of time. In addition, the conveyor spacer assembly makes it possible to maintain uniform predetermined spacing between each of the frames so that the process parameters can be readily controlled.

It will be noted that the conveyor spacer assembly 88 utilizes a digital approach which is quite precise in its operation.

After a frame has been advanced from chamber A in the manner hereinbefore described and the leading edge of the frame 286 has interrupted the first of the 47 light beams, in the conveyor assembly 88 the gate valve V2 closes. Chamber A is then vented to the atmosphere. Valve V1 is opened and the next frame is advanced into chamber A. The cycle hereinbefore described is then repeated.

During operation of the apparatus, it is desirable to keep the vacuum in chamber B at an average which is about 10 microns. Chamber C is also maintained at this average vacuum.

As the frame 286 with the glass substrate 288 is carried into chamber C, the glass is heated in this chamber to the temperature or slightly above the temperature at which it is desired to maintain the glass substrate 288 during the coating process. This heating is accomplished by the glass heater assembly 93 mounted at the top of chamber C. This heater assembly causes the heat to radiate downwardly onto the glass. It is important that the glass substrate in the chamber C be heated to a temperature which is at least slightly above any temperature which will be encountered during the remainder of the process. This will ensure proper outgassing of the glass and the frame in chamber C so that further outgassing will be reduced in the subsequent chambers.

As the glass substrate 288 and the frame 286 carrying the same is slowly advanced through the chamber C, it is heated and then it passes into the chamber D through the first heated seal duct assembly 98 mounted at the entrance to the chamber. As pointed out previously, this heated seal duct assembly is provided with a relatively narrow slot 99 so as to make it possible to maintain a pressure differential between chambers C and D and the gasses which are present in chamber D. Chamber D can be identified as the glow chamber and may have an atmosphere of a certain gas such as oxygen therein at a fixed pressure ranging from 10 – 15 microns which corresponds to $1 - 5 \times 10^{-2}$ torr. It is desirable that this pressure be not unduly affected by the automatic cycling which is occurring at chamber A and B of the apparatus. In other words, it is very desirable that chamber D be maintained at a constant predetermined pressure so that glow discharge cleaning of the underside of the glass substrate 288 can take place within chamber D. The glow discharge cleaning takes place in the conventional manner by the plurality of glow discharge electrode assemblies 106 provided within the chamber D. It will be noted that the chamber D is twice the length of chamber C. This is desirable because the glass substrates move through the chamber C and D at the same rate of speed and it requires a longer period of time for glow discharge cleaning of the glass substrate than it does for heating of the glass substrate.

After glow discharge cleaning, the glass substrate 288 is ready to be introduced into the high vacuum portion of the apparatus for treatment for application of the coatings. During passage through the chamber D, it is possible that the temperature of the glass may have dropped slightly and it may, therefore, be necessary to further heat the glass to bring it up to the desired temperature. Also, the pressure within the chamber D is too high for subsequent processing steps and, therefore, it is necessary to reduce the pressure. This is accomplished in the chamber E which, as explained previously, is provided with four separate chambers 116, each of which is provided with a heated seal duct assembly 118. As explained previously, each of these chambers 116 is individually pumped and the pressure is gradually brought down in the four chambers 116 until the pressure has been reduced to approximately 1 × $10^{-6}$ torr. During the time that the glass substrate is passing through the chamber E, it is heated by the heated seal duct assemblies 118 so that the glass substrate 288 is brought up to and maintained at the desired temperature.

The chamber F which precedes the chamber G and the chamber H which follows the chamber G are both maintained at a pressure which is the lowest in the entire apparatus and should be lower than the pressure in the chamber G so that there always is a gas flow from chamber G to chambers F and H. In this way, it is possible to positively control the composition of the gas of the six coating chambers 153 provided in the section G. The chambers 153 in section G are maintained at a predetermined pressure ranging from 1 × $10^{-4}$ to 1 × $10^{-6}$ torr. By starting with a pressure in one of the chambers 153 and then adding a gas to the system to raise the pressure, it is possible to control the environment within the chamber very closely. Since six of the chambers 153 have been provided, it is possible to apply from one to six layers of various types of coating on the glass substrate 288 in one pass through the apparatus. This is possible because each of the chambers 153 is separately pumped as hereinbefore described. It is also provided with an evaporation source 163 and an evaporation rate monitor 186. During operation of the apparatus, the evaporation source is operated and the vapor streams emanating therefrom pass upwardly through the shielding structure 166 onto the bottom surface of the glass substrate 288. The amount of coating material is monitored by the evaporation rate monitor 186 and this automatically controls the rate of evaporation from the evaporation source so that the desired thickness of the layer being deposited on the substrate is obtained. In order to obtain a uniform distribution across the bottom of the glass substrate, the shielding assemblies 191 provided in each of the chambers 153 is utilized. The shielding member 201 can be extended or retracted to obtain the desired uniformity.

The thickness of the coating layer being deposited upon the glass substrate can be varied by changing the rate of travel through the chamber. However, since it is desirable to maintain a uniform rate of travel through all of the chambers, the thickness of the coatings are controlled by the rate of evaporation from the source which can be varied as desired and controlled by the evaporation monitor 186.

When the glass substrate 288 is passed through the last of the coating chambers 153, it passes into the chamber H, the purpose of which was explained previously, after which it passes into chamber I. Chamber I is differentially pumped in two sections. The seal ducts are utilized for maintaining this differential in pressure. After passing through chamber I, the glass substrate passes into chamber J towards the gate valve V3. When the exit chamber K has been cleared and is ready to receive the next frame 286 with a glass substrate thereon, the apparatus is automatically cycled to open valve V3. As soon as the valve V3 is opened, the conveyor assembly 247 is operated at a high rate of speed to advance the same onto the conveyor 251 in chamber K. Means is provided for stopping the frame 286 within the chamber K when it is within the chamber K. The valve V3 is closed and thereafter the chamber K is vented to the atmosphere. Valve V4 is then opened and the frame 286 and the glass 288 carried thereby are rapidly advanced out of chamber K by operation of the conveyor 251 onto the exit conveyor 252, after which it is delivered to a down elevator 253. The frame 286 with the glass substrate 288 is then lowered and thereafter the glass substrate is separated from the frame. The glass can then be cut to remove the uncoated outer margins which were covered up by the frame. The frames are returned to the other end of the apparatus and are ready for loading and re-use in the apparatus.

It will be noted that fewer seal ducts are required at the exit end of the apparatus than at the entrance end. This is because at the entrance end, the principal gas load is from the glow discharge chamber, thus requiring additional pumping at the end and additional seal duct assemblies.

It is apparent from the foregoing that a unique multi-layer coating apparatus, system and method has been provided. The arrangement of the apparatus is such that the glass substrate is heated prior to glow discharge cleaning. If the glow discharge cleaning has occurred first, the subsequent heating could possibly affect the cleaned surface on the glass which had been prepared.

There is ample provision in the apparatus for heating the substrate and for maintaining the substrate at the desired temperature. The apparatus also has the advantage that there is provision for heating between layers so that layers can be applied at different temperatures.

During processing in the apparatus, the glass substrate which is being coated travels in a horizontal position with the surface being coated facing downwardly. This is very desirable because this bottom surface remains much cleaner because material cannot fall down on it from the top. The horizontal mounting of the substrates is also advantageous because it is easier to provide a source in which the vapor streams pass upwardly from the source. In addition, it is possible to obtain a source which will provide a more symmetrical distribution. Also, it is more advantageous to evaporate many materials particularly from an electron gun source where materials are generally disposed in parallel to the surface which is to be coated.

The apparatus has the advantage in that if coating materials do build up upon the interior of the chambers, such material can fall off without affecting the bottom surface of the substrate which is being coated. The shielding structure 166 prevents any material which falls off from falling back into the source.

The relatively narrow or shallow conveyors which are utilized make it possible to use relatively small segregation valves in the form of the valves V1, V2, V3 and V4. There is no necessity for a large opening. All that is required is a narrow opening for the frame which carries the substrate which is to be coated. For the main coating chamber G and the chambers F and H on opposite sides of the same, there is only one conveyor system which makes it necessary to only drive this conveyor system from one end. The desired flexibility is still retained without the disadvantages of outgassing during heating.

The heated seal ducts perform two functions in that they provide the desired sealing and at the same time provide a means for heating the substrates to the desired temperature.

We claim:

1. In a multiple layer coating apparatus for coating substrates carried by frames disposed in generally horizontal positions, means forming at least one coating chamber, a vertically disposed coating material source in the coating chamber for vaporizing at least one material for carrying out coating operations in the coating chamber whereby the vaporized material moves upwardly, means forming an entrance chamber in communication with the coating chamber, means forming an exit chamber in communication with the coating chamber, valve means disposed at opposite ends of each of the entrance and exit chambers for sealing said entrance and exit chambers and interrupting communication with said coating chamber, means for creating a vacuum condition in the coating chamber, a separate driven conveyor assembly provided in each of the entrance chambers, the coating chamber and the exit chamber for receiving and advancing the frames and substrates therethrough so that the frames carrying the substrates and the substrates are maintained in a generally horizontal position in at least the coating chamber with the bottom sides of the substrates being exposed to the vapor stream from the source, said driven conveyor assembly in the coating chamber having a horizontal supporting surface upon which said frames are adapted to rest during travel through the coating chamber, said separate driven conveyor in said coating chamber being driven at a substantially uniform slow speed, said valve means being movable to open positions to permit said frames to pass therethrough, said separate driven conveyor assemblies in said entrance chamber and said exit chamber being capable of being driven at a fast speed in comparison to said slow speed and frame spacing means including means having a plurality of sensing elements in excess of two adapted to be actuated by the frames for sensing the spacing between frames for controlling the operation of the conveyor assemblies whereby a frame is moved rapidly out of the entrance chamber toward the coating chamber until a predetermined spacing exists between it and the preceding frame for maintaining a predetermined minimum spacing between the frames during their travel through the coating chamber.

2. Apparatus as in claim 1 together with means forming an additional chamber between said entrance chamber and said coating chamber and additional conveyor means mounted in said additional chamber operable at a fast speed and at a slow speed with the fast speed corresponding to the speed of the conveyor assembly in the entrance chamber and with the slow speed corresponding to the speed of the conveyor assembly in the coating chamber, and wherein said frame spacing means includes means for sensing when a predetermined spacing exists between the frames to cause the additional conveyor assembly to change from a fast speed of operation to a slow speed fo operation.

3. Apparatus as in claim 1 together with means forming a heating chamber disposed prior to the coating chamber for receiving substrates carried by the frames, means in the heating chamber for heating the substrates carried by the frames prior to entrance into the coating chamber and means for glow discharge cleaning the substrates after the substrates have been heated.

4. Apparatus as in claim 1 together with an additional chamber disposed on each of the opposite ends of the coating chamber and between the entrance and exit chambers and through which the carriers and substrates pass, the additional chambers being normally maintained at a pressure which is lower than the pressure in the coating chamber and the entrance and exit chambers so that there is a flow of gas out of the coating chamber in both directions.

5. Apparatus as in claim 1 wherein said coating material source in the coating chamber for vaporizing at least one material is in the form of a single source.

6. Apparatus as in claim 1 wherein a plurality of serially arranged coating chambers are provided together with a vertically disposed coating material source in each coating chamber, means in certain of said coating chambers for heating the substrate, an evaporation rate monitor in each coating chamber for controlling the rate of evaporation from the source in that coating chamber and seal duct means mounted between said entrance chamber and the first coating chamber in series and and said exit chamber and the last coating chamber in the series so that a pressure differential can be maintained between said coating chambers and the other chambers whereby leakage with respect to the coating chambers can occur only outward from the coating chambers.

7. Apparatus as in claim 6 wherein said seal duct means includes means for supplying heat to the substrate at the same time that the substrate is passing through the seal duct means.

8. Apparatus as in claim 6 wherein at least certain of said coating chambers are provided with masking means, said masking means being adjustable for movement in a direction which is parallel to the path of travel of the substrates through the apparatus.

9. Apparatus as in claim 5 together with means in the coating chamber for shielding the source in the coating chamber, said means for shielding including a shielding structure surrounding the source, the shielding structure having an opening overlying the source, said means for shielding also including a shielding member having a size larger than said opening, and means for moving said shielding member between a position overlying said opening and an out-of-the-way position.

10. Apparatus as in claim 8 wherein said masking means includes a horizontally disposed shielding member having an arcuate edge which extends laterally of the chamber, together with means for causing rectilinear movement of said shielding member in said coating chamber in a direction parallel to the path of travel of the substrates in the coating chamber and between the substrates and the source.

11. Apparatus as in claim 1 wherein said means having a plurality of sensing elements in excess of two adapted to be actuated by the frames for sensing the spacing between the frames includes means forming a plurality of light beams disposed in the path of travel of the frames so that the light beams are interrupted by the frames as they are advanced, means for sensing the presence or absence of at least certain of the light beams, comparator means, means connecting said comparator means to said means for sensing the presence or absence of light beams, variable reference means connected to said comparator means for supplying signals having preselected levels to said comparator means, said comparator means determining whether the signal from the reference means is greater or less than the signal from the means for sensing the presence or absence of light beams and supplying a signal for controlling the operation of the conveyor assemblies.

12. In a multi-layer coating apparatus for coating substrates carried by frames disposed in generally horizontal positions, means forming at least one coating chamber, a coating material source in the coating chamber for vaporizing at least one material for carrying out coating operations in the coating chamber, means forming an entrance chamber, means forming an exit chamber, valve means disposed at opposite ends of each of said entrance and exit chambers, means for creating a vacuum condition in the coating chamber, a separate conveyor assembly provided in each of the entrance chamber, the coating chamber and the exit chamber for receiving and advancing the frames and substrates sequentially therethrough with the frames, and the substrates being maintained in a generally horizontal position in at least the coating chamber with the bottom sides of the substrates being exposed to the vapor stream from the source, frame spacing means for controlling the operation of the separate conveyor assemblies, said frame spacing means including means for sensing when a predetermined spacing exists between the frames to cause one of the conveyor assemblies to change its speed of operation so that the frames are prevented from bumping into each other.

13. In a multiple layer coating apparatus for coating substrates carried by frames disposed in generally horizontal positions, means forming at least one coating chamber, a vertically disposed coating material source in the coating chamber for vaporizing at least one material for carrying out coating operations in the coating chamber whereby the vaporized material moves upwardly, means forming an entrance chamber, means forming an exit chamber, valve means disposed at opposite ends of each of the entrance and exit chambers, means for creating a vacuum condition in the coating chamber, separate conveyor assemblies provided in each of the entrance chamber, the coating chamber and the exit chamber for receiving and advancing the frames and substrates therethrough so that the frames carrying the substrates and the substrates are maintained in a generally horizontal position in at least the coating chamber with the bottom sides of the substrates being exposed to the vapor stream from the source, frame spacing means for controlling the operation of the separate conveyor assemblies whereby a frame with a substrate thereon is advanced rapidly out of the entrance chamber and toward the coating chamber and is rapidly advanced into the exit chamber from the coating chamber, means for causing the conveyor assembly in the coating chamber to be operated at a substantially constant speed which is slower than the speeds at which the conveyor assemblies in the entrance and exit chambers are operated, means forming an additional chamber between said entrance chamber and said coating chamber and an additional conveyor assembly mounted in said additional chamber operable at a fast speed and at a slow speed with a fast speed corresponding to the speed of the conveyor assembly in the entrance chamber and with the slow speed corresponding to the speed of the conveyor assembly in the coating chamber, said frame spacing means including means for sensing when a predetermined spacing exists between certain of the frames to cause the additional conveyor assembly to change from a fast speed of operation to a slow speed of operation, said means for sensing the spacing between the frames including a photocell assembly with a plurality of photocells arranged longitudinally of the direction of travel of the frames and means for directing collimated beams of light onto the photocells, said beams of light being adapted to be interrupted by frames travelling through the frame spacing sensing means, and means for causing the additional conveyor assembly to operate at the slow speed when the light beams through more than a predetermined number of photocells are interrupted by the frames.

14. In a multiple layer coating apparatus for coating substrates carried by frames disposed in generally horizontal positions, means forming at least one coating chamber, a vertically disposed coating material source in the coating chamber for vaporizing at least one material for carrying out coating operations in the coating chamber whereby the vaporized material moves upwardly, means forming an entrance chamber in communication with the coating chamber, means forming an exit chamber in communication with the coating chamber, valve means disposed at opposite ends at each of the entrance and exit chambers for sealing said exit and entrance chambers and interrupting communication with said coating chamber, means for creating a vacuum condition in the coating chamber, a separate driven conveyor assembly provided in each of the entrance chambers, the coating chamber and the exit chamber for receiving and advancing the frames and substrates therethrough so that the frames carrying the substrates and the substrates are maintained in generally horizontal positions in at least the coating chamber with the bottom sides of the substrates being exposed to the vapor stream from the source, said driven conveyor assembly in the coating chamber having a horizontal supporting surface upon which said frames are adapted to rest during travel through the coating chamber, said separate driven conveyor and said coating chamber being driven at a substantially unform slow speed, said valve means being movable to open positions to permit said frames to pass therethrough, said driven conveyor assemblies in said entrance chamber and said exit chamber being capable of being driven at a fast speed in comparison to said slow speed, frame sparing means including means for sensing the spacing between frames for controlling the operation of the conveyor assemblies whereby a frame is moved rapidly out of the entrance chamber toward the coating chamber until a predetermined spacing exists between it and the preceding frame for maintaining a predetermined minimum spacing between the frames during their travel through the coating chamber, seal duct means mounted between said entrance chamber, said coating chamber and said exit chamber so that a pressure differential can be maintained between said chambers, said seal duct means including means for supplying heat to the substrate at the same time that the substrate is passing through the seal duct means, said seal duct means being formed of a sheet meterial having a relatively high resistance to form electrical heating means and means for supplying a current to said sheet material.

* * * * *